(12) United States Patent
Murata

(10) Patent No.: US 10,389,959 B2
(45) Date of Patent: Aug. 20, 2019

(54) IMAGE-CAPTURING DEVICE AND IMAGE SENSOR

(71) Applicant: NIKON CORPORATION, Tokyo (JP)

(72) Inventor: Hironobu Murata, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/794,710

(22) Filed: Oct. 26, 2017

(65) Prior Publication Data

US 2018/0048837 A1 Feb. 15, 2018

Related U.S. Application Data

(63) Continuation of application No. 14/389,626, filed as application No. PCT/JP2013/059621 on Mar. 29, 2013, now Pat. No. 9,826,183.

(30) Foreign Application Priority Data

Mar. 30, 2012 (JP) ................................ 2012-081165

(51) Int. Cl.
*H04N 5/232* (2006.01)
*G02B 7/34* (2006.01)
(Continued)

(52) U.S. Cl.
CPC ............. *H04N 5/3696* (2013.01); *G02B 7/34* (2013.01); *H01L 27/14607* (2013.01);
(Continued)

(58) Field of Classification Search
CPC ........................ H01L 27/1421; H04N 5/23212
See application file for complete search history.

(56) References Cited

U.S. PATENT DOCUMENTS 4,589,003 A 5/1986 Yamada et al.
6,958,862 B1 10/2005 Joseph
(Continued)

FOREIGN PATENT DOCUMENTS

AU 2004200841 A1 3/2004
CN 101821657 A 9/2010
(Continued)

OTHER PUBLICATIONS

Jan. 2, 2018 Office Action issued in Chinese Application No. 201380017868.6.
(Continued)

*Primary Examiner* — Thanh Luu
(74) *Attorney, Agent, or Firm* — Oliff PLC

(57) ABSTRACT

An image-capturing device includes an image sensor. The image sensor includes an upper layer pixel group and a lower layer pixel group that receives the light fluxes from the subject that have passed through each pixel in the upper layer pixel group. The lower layer pixel group includes fourth, fifth and sixth pixels having fourth, fifth and sixth spectral sensitivities, respectively, that are complementary to first, second, and third spectral sensitivities, respectively, of the upper layer pixel group, being arranged in a two-dimensional pattern. Positions of first, second and third pixels in the upper layer pixel group and positions of the fourth, fifth and sixth pixels in the lower layer pixel group are determined such that the fourth, fifth and sixth pixels receive light fluxes that pass through the first, second and third pixels, respectively.

17 Claims, 18 Drawing Sheets

(51) Int. Cl.
*H04N 5/369* (2011.01)
*H01L 27/146* (2006.01)
*H04N 5/378* (2011.01)
*H04N 9/04* (2006.01)

(52) U.S. Cl.
CPC .. *H01L 27/14621* (2013.01); *H01L 27/14627* (2013.01); *H04N 5/23212* (2013.01); *H04N 5/378* (2013.01); *H04N 9/045* (2013.01)

(56) References Cited

U.S. PATENT DOCUMENTS

| | | | |
|---|---|---|---|
| 9,385,148 | B2 | 7/2016 | Murata |
| 2004/0100570 | A1 | 5/2004 | Shizukuishi |
| 2004/0119843 | A1 | 6/2004 | Hoshuyama |
| 2006/0197172 | A1 | 9/2006 | Oda |
| 2006/0266921 | A1 | 11/2006 | Kang et al. |
| 2007/0237512 | A1 | 10/2007 | Kusaka |
| 2008/0084483 | A1 | 4/2008 | Kusaka |
| 2008/0218611 | A1 | 9/2008 | Parulski et al. |
| 2008/0219654 | A1 | 9/2008 | Border et al. |
| 2008/0259202 | A1 | 10/2008 | Fujii |
| 2008/0303072 | A1 | 12/2008 | Lee et al. |
| 2009/0072122 | A1 | 3/2009 | Tada et al. |
| 2009/0200584 | A1 | 8/2009 | Tweet et al. |
| 2010/0141771 | A1 | 6/2010 | Hu |
| 2010/0165176 | A1 | 7/2010 | Taniguchi |
| 2010/0277625 | A1 | 11/2010 | Utsugi |
| 2010/0283863 | A1 | 11/2010 | Yamamoto |
| 2010/0328503 | A1 | 12/2010 | Shintani et al. |
| 2011/0032376 | A1 | 2/2011 | Takizawa |
| 2011/0109776 | A1 | 5/2011 | Kawai |
| 2011/0128430 | A1 | 6/2011 | Fossum et al. |
| 2011/0176795 | A1 | 7/2011 | Won et al. |
| 2011/0204461 | A1 | 8/2011 | Lee |
| 2011/0317048 | A1* | 12/2011 | Bai ............... H01L 27/1461 348/294 |
| 2012/0026370 | A1 | 2/2012 | Oike et al. |
| 2012/0062786 | A1 | 3/2012 | Hamano |
| 2013/0182173 | A1 | 7/2013 | Murata |
| 2013/0234029 | A1 | 9/2013 | Bikumandla |
| 2016/0219233 | A1 | 7/2016 | Murata |

FOREIGN PATENT DOCUMENTS

| | | |
|---|---|---|
| CN | 101193209 B | 9/2012 |
| EP | 2 172 973 A1 | 4/2010 |
| JP | 2001-021792 A | 1/2001 |
| JP | 2004-172278 A | 6/2004 |
| JP | 2004-200902 A | 7/2004 |
| JP | 2006-237136 A | 9/2006 |
| JP | 200711070 A | 1/2007 |
| JP | 2007-67075 A | 3/2007 |
| JP | 200767075 A | 3/2007 |
| JP | 2007-282109 A | 10/2007 |
| JP | 2007-317951 A | 12/2007 |
| JP | 2007-324405 A | 12/2007 |
| JP | 2008-258474 A | 10/2008 |
| JP | 2009/99867 A | 5/2009 |
| JP | 2009-130239 A | 6/2009 |
| JP | 2010-239337 A | 10/2010 |
| JP | 2010-532869 A | 10/2010 |
| JP | 2010-263572 A | 11/2010 |
| JP | 2011-103335 A | 5/2011 |
| JP | 2012-029130 A | 2/2012 |
| WO | 2009/104417 A1 | 8/2009 |

OTHER PUBLICATIONS

May 28, 2013 International Search Report issued in International Application No. PCT/JP2013/059621.
Nov. 5, 2015 Extended Search Report issued in European Patent Application No. 13767811.6.
Sep. 12, 2016 Office Action issued in U.S. Appl. No. 14/389,626.
Sep. 29, 2015 Search Report issued in European Patent Application No. 13735697.8.
Jun. 2, 2015 Office Action issued in Japanese Patent Application No. 2014-117789.
Nov. 2, 2015 Office Action issued in Chinese Patent Application No. 201380005298.9.
Dec. 15, 2015 Office Action issued in Japanese Patent Application No. 2014-117789.
Nov. 11, 2015 Office Action in Russian Patent Application No. 2014133174.
Apr. 15, 2016 Office Action issued in Korean Patent Application No. 10-2014-7022562.
Aug. 29, 2016 Office Action issued in Chinese Patent Application No. 201380005298.9.
Feb. 6, 2017 Office Action Issued in U.S. Appl. No. 14/389,626.
Nov. 15, 2016 Office Action issued in Japanese Patent Application No. 2014-508109.
Mar. 1, 2017 Office Action issued in Chinese Application No. 201380017868.6.
Jun. 6, 2017 Office Action issued in Japanese Application No. 2014-508109.
Jul. 19, 2017 Notice of Allowance issued in U.S. Appl. No. 14/389,626.
Oct. 8, 2014 Office Action issued in U.S. Appl. No. 13/736,204.
Jun. 29, 2015 Office Action issued in U.S. Appl. No. 13/736,204.
Jan. 4, 2016 Notice of Allowance issued in U.S. Appl. No. 13/736,204.
Aug. 16, 2016 Office Action issued in U.S. Appl. No. 15/088,436.
Sep. 5, 2018 Office Action issued in Chinese Application No. 201380017868.6.
Nov. 27, 2018 Office Action issued in Japanese Application No. 2017-171144.
Apr. 10, 2019 Office Action issued in Chinese Patent Application No. 201380017868.6.

* cited by examiner

FIG.2
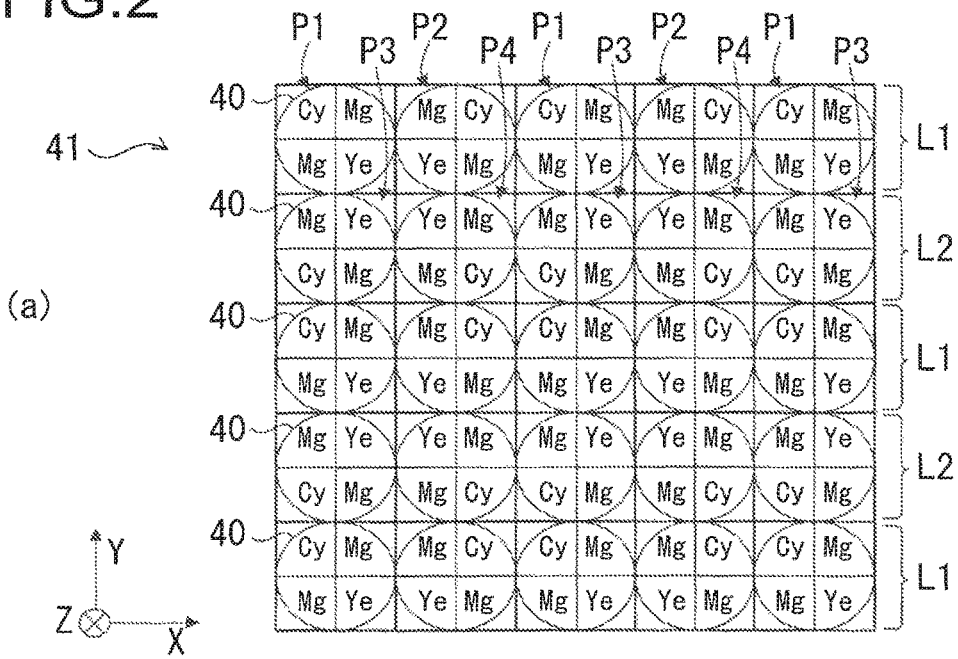
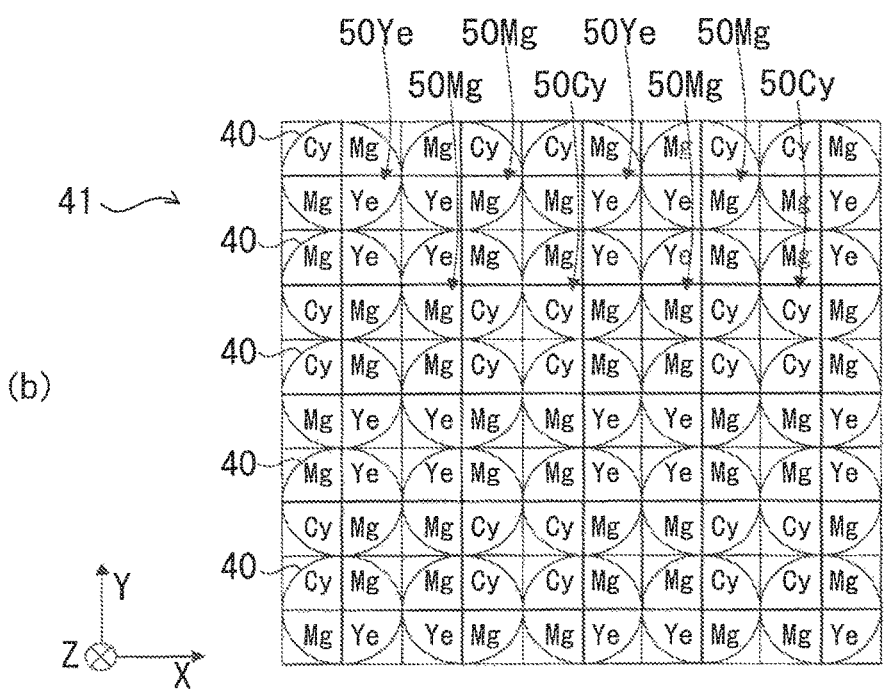

FIG.3
(a) 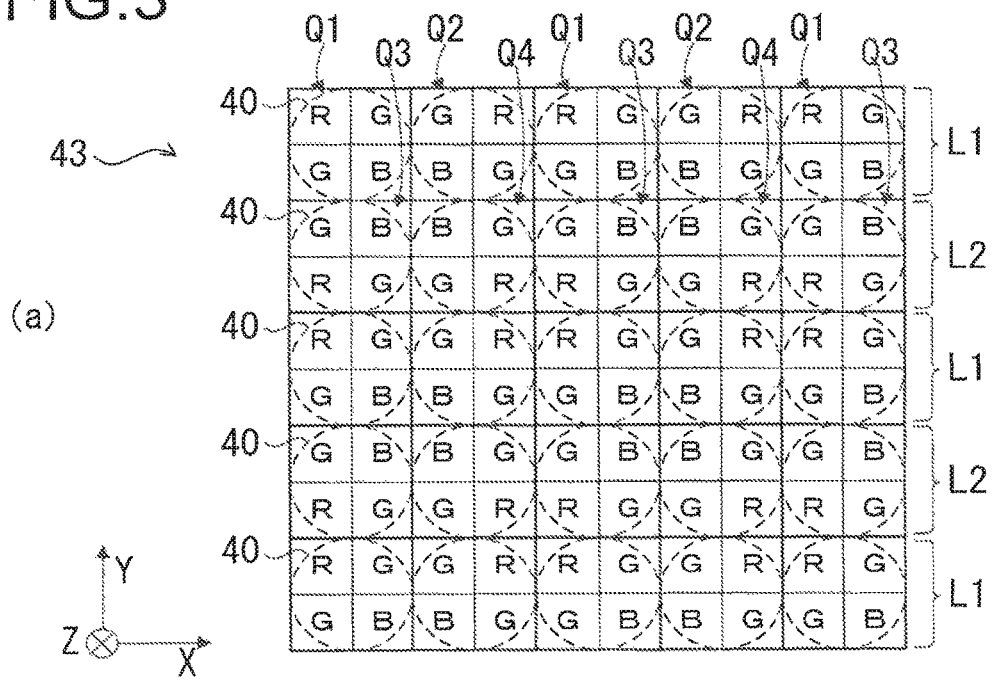
(b) 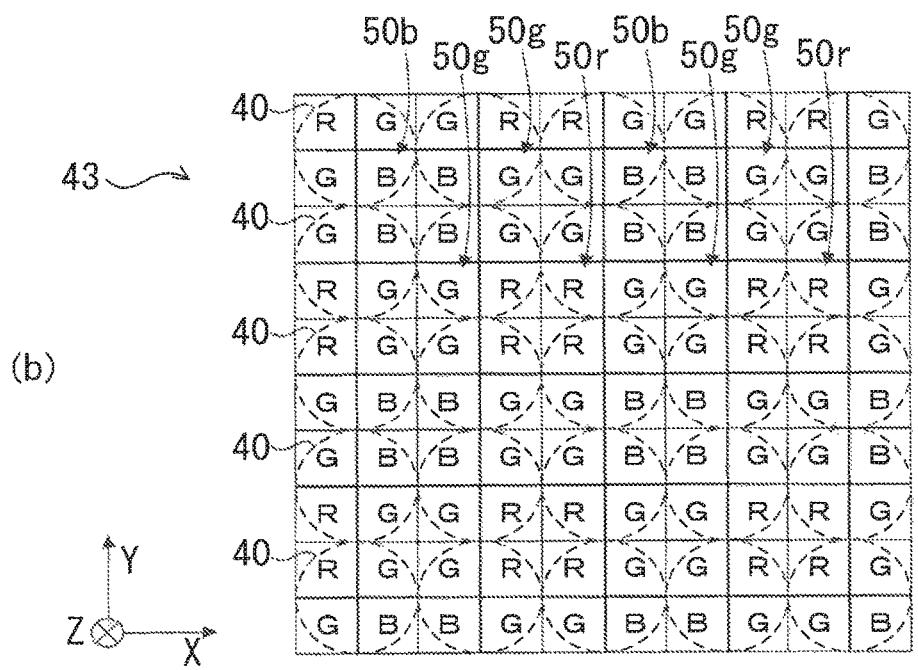

FIG.14
(a) 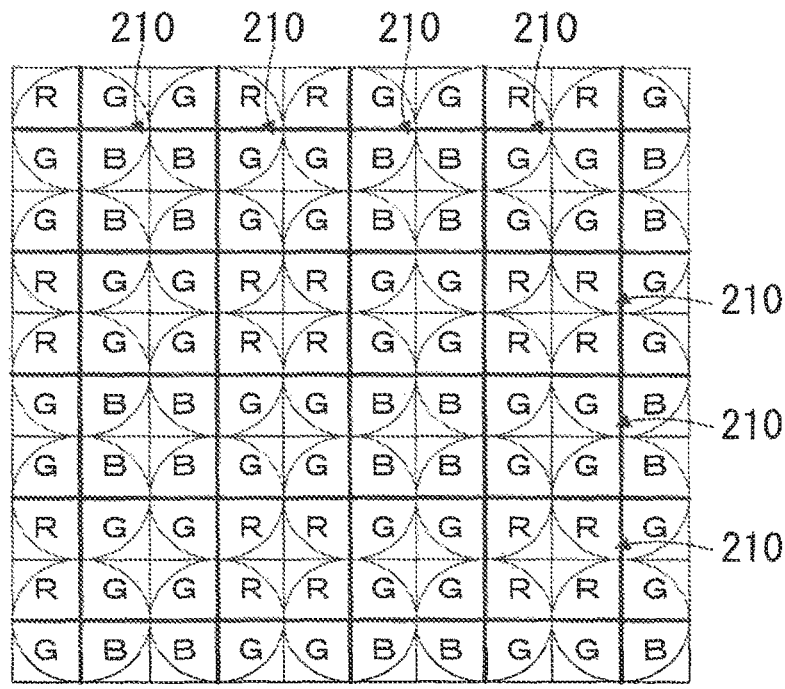
(b) 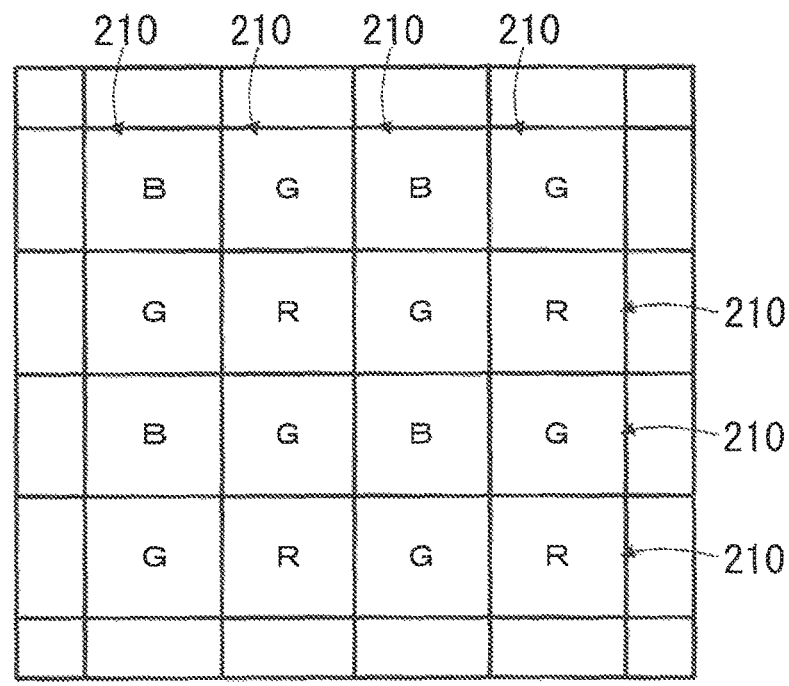

FIG.15
(a) 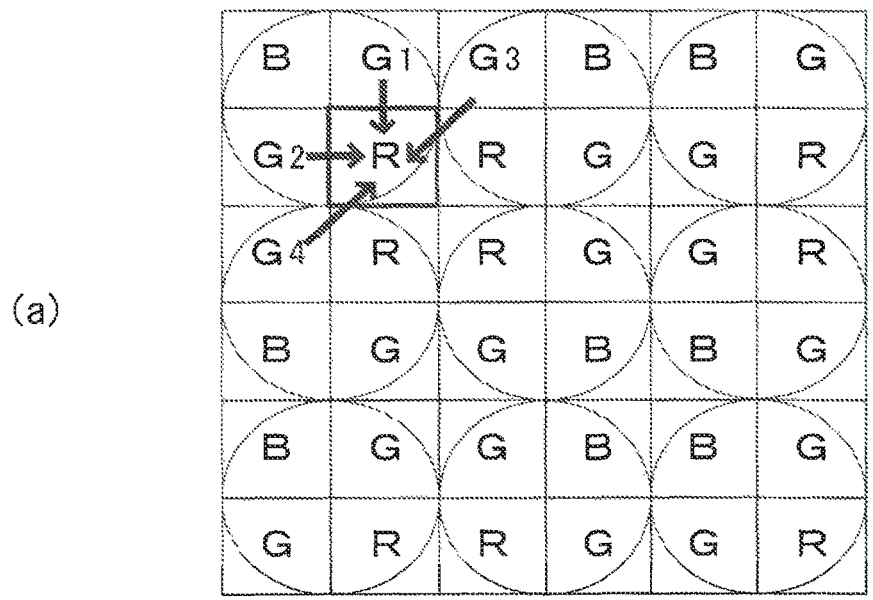
(b) 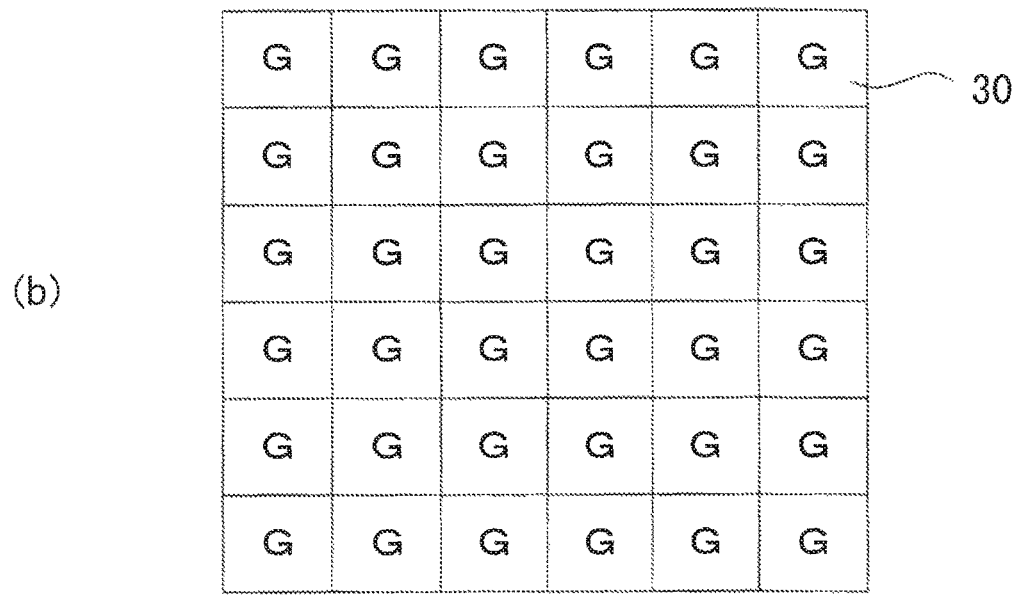

| RGB | RGB | RGB | RGB | RGB | RGB | RGB | RGB | RGB | RGB |
|---|---|---|---|---|---|---|---|---|---|
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |
| RGB | RGB | RGB | RGB | RGB | RGB | RGB | RGB | RGB | RGB |

~30

(b)

| YCr Cb | YCr Cb | YCr Cb | YCr Cb | YCr Cb | YCr Cb | YCr Cb | YCr Cb |
|---|---|---|---|---|---|---|---|
| YCr Cb | YCr Cb | YCr Cb | YCr Cb | YCr Cb | YCr Cb | YCr Cb | YCr Cb |
| YCr Cb | YCr Cb | YCr Cb | YCr Cb | YCr Cb | YCr Cb | YCr Cb | YCr Cb |
| YCr Cb | YCr Cb | YCr Cb | YCr Cb | YCr Cb | YCr Cb | YCr Cb | YCr Cb |
| YCr Cb | YCr Cb | YCr Cb | YCr Cb | YCr Cb | YCr Cb | YCr Cb | YCr Cb |
| YCr Cb | YCr Cb | YCr Cb | YCr Cb | YCr Cb | YCr Cb | YCr Cb | YCr Cb |
| YCr Cb | YCr Cb | YCr Cb | YCr Cb | YCr Cb | YCr Cb | YCr Cb | YCr Cb |
| YCr Cb | YCr Cb | YCr Cb | YCr Cb | YCr Cb | YCr Cb | YCr Cb | YCr Cb |
| YCr Cb | YCr Cb | YCr Cb | YCr Cb | YCr Cb | YCr Cb | YCr Cb | YCr Cb |
| YCr Cb | YCr Cb | YCr Cb | YCr Cb | YCr Cb | YCr Cb | YCr Cb | YCr Cb |

~30

IMAGE-CAPTURING DEVICE AND IMAGE SENSOR

This application is a continuation application of U.S. patent application Ser. No. 14/389,626 filed Apr. 8, 2015, the disclosure of which is incorporated herein by reference in its entirety.

TECHNICAL FIELD

The present invention relates to an image-capturing device and an image sensor.

BACKGROUND ART

An image-capturing device is known which performs focus detection by a split-pupil phase detection method on the basis of output signals from a plurality of pixels dedicated for focus detection arranged on a part of an image sensor (see Patent Literature 1).

CITATION LIST

Patent Literature

Patent Literature 1: Japanese Patent Application Laid-open No. 2007-282109.

SUMMARY OF INVENTION

Technical Problem

To perform focus detection by the conventional art, the focus detection is possible only at positions where pixels dedicated for focus detection are arranged. However, an increased number of pixels dedicated for focus detection results in a decrease in image quality since no image signal is obtained from the positions where the pixels dedicated for focus detection are arranged. As described above, according to the conventional technology, it is made possible to perform focus detection according to a phase detection method as well as generation of image signals based upon output signals from image sensor. On the other hand, there occurs an adverse effect due to provision of the pixels dedicated for focus detection at a part of the image sensor.

Solution to Problem

According to the 1st aspect of the present invention, an image-capturing device comprises: an image sensor that captures an image of a subject with light fluxes from the subject that have passed through an imaging optical system; an image generation unit that generates an image signal based upon an output signal from the image sensor; and a focus detection unit that detects a focusing condition of the imaging optical system according to a phase detection method based upon an output signal from the image sensor. The image sensor includes an upper layer pixel group and a lower layer pixel group that receives the light fluxes from the subject that have passed through each pixel in the upper layer pixel group, and a microlens group arranged so as to guide the light fluxes from the subject to the upper layer pixel group. The upper layer pixel group includes first, second and third pixels having first, second and third spectral sensitivities, respectively, differing from each other, and being arranged in a two-dimensional pattern, with one of the first pixels, one of the second pixels and two of the third pixels being arranged in a two-by-two matrix behind each of microlenses in the microlens group, and the four pixels receive four light fluxes, respectively, that pass through four pupil areas, respectively, of an exit pupil of the imaging optical system. The lower layer pixel group includes fourth, fifth and sixth pixels having fourth, fifth and sixth spectral sensitivities, respectively, that are complementary to the first, second, and third spectral sensitivities, respectively, of the upper layer pixel group, being arranged in a two-dimensional pattern. Positions of the first, second and third pixels in the upper layer pixel group and positions of the fourth, fifth and sixth pixels in the lower layer pixel group are determined such that the fourth, fifth and sixth pixels receive light fluxes that pass through the first, second and third pixels, respectively. The image generation unit generates the image signal based upon an output signal from one of the upper layer pixel group and the lower layer pixel group. The focus detection unit detects the focusing condition based upon an output signal from other of the upper layer pixel group and the lower layer pixel group.

According to the 2nd aspect of the present invention, in the image-capturing device according to the 1st aspect, it is preferred that, in the upper layer pixel group, the first, second, and third pixels are arranged such that pixels having substantially same spectral sensitivities are adjacently arranged in a two-by-two matrix, and four pixels adjacent to the two-by-two matrix are arranged behind four different microlenses in the microlens group, respectively, and at different positions with respect to the microlenses.

According to the 3rd aspect of the present invention, in the image-capturing device according to the 2nd aspect, it is preferred that, in the upper layer pixel group, the first, second and third pixels provide output signals relating to cyan, yellow, and magenta, respectively, and, in the lower layer pixel group, the fourth, fifth and sixth pixels provide output signals relating to colors complementary to the cyan, yellow and magenta, respectively.

According to the 4th aspect of the present invention, in the image-capturing device according to the 3rd aspect, it is preferred that, the upper layer pixel group and the lower layer pixel group each include an array of a plurality of sets of pixels arranged in a two-dimensional pattern, each of the plurality of sets of pixels having four pixels arranged in a two-by-two matrix behind any particular one of the microlenses and the sets include first through fourth sets having different arrangements of pixels, and the upper layer pixel group is configured such that in the first set, the first pixel and the third pixel are adjacently arranged in a predetermined array direction and the third pixel and the second pixel are arranged adjacent to the first pixel and the third pixel, respectively, in a direction perpendicular to the predetermined array direction, in the second set, the third pixel and the first pixel are adjacently arranged in the predetermined array direction and the second pixel and the third pixel are arranged adjacent to the third pixel and the first pixel, respectively, in the direction perpendicular to the predetermined array direction, in the third set, the third pixel and the second pixel are adjacently arranged in the predetermined array direction and the first pixel and the third pixel are arranged adjacent to the third pixel and the second pixel, respectively, in the direction perpendicular to the predetermined array direction, in the fourth set, the second pixel and the third pixel are adjacently arranged in the predetermined array direction and the third pixel and the first pixel are arranged adjacent to the second pixel and the third pixel, respectively, in the direction perpendicular to the predetermined array direction, and the first set and the second set are adjacent to each other in the predetermined array direction and alternately arranged in a repeated manner in the predetermined array direction, the third set and the fourth set are adjacent to each other in the predetermined array direction and alternately arranged in a repeated manner in the predetermined array direction, and a first row formed by the first set and the second set and a second row formed by the third set and the fourth set are adjacent to each other in the direction perpendicular to the predetermined array direction and alternately arranged in a repeated manner in the direction perpendicular to the predetermined array direction.

According to the 5th aspect of the present invention, in the image-capturing device according to any one of the 2nd to 4th aspects, it is preferred that the image generation unit adds output signals from four of the fourth pixels that are adjacent to each other in a form of a two-by-two matrix, adds output signals from four of the fifth pixels that are adjacent to each other in a form of a two-by-two matrix, and adds output signals from four of the sixth pixels that are adjacent to each other in a form of a two-by-two matrix to generate an image signal of a Bayer arrangement.

According to the 6th aspect of the present invention, in the image-capturing device according to any one of the 1st to 4th aspects, it is preferred that the image generation unit obtains three color signals at a position corresponding to each microlens based upon output signals from the fourth, fifth and sixth pixels positioned behind each microlens.

According to the 7th aspect of the present invention, in the image-capturing device according to any one of the 1st to 4th aspects, it is preferred that the image generation unit executes, at respective positions of the fourth through sixth pixels, color interpolation processing for generating signals of other two spectral components to obtain three color signals and generates a luminance signal and color difference signals based upon the three color signals thus obtained.

According to the 8th aspect of the present invention, in the image-capturing device according to any one of the 1st to 7th aspects, it is preferred that the focus detection unit detects the focusing condition of the imaging optical system based upon output signals from a pair of pixels having substantially the same spectral sensitivities and located at positions differing from each other with respect to the microlens, out of the upper layer pixel group or the lower layer pixel group.

According to the 9th aspect of the present invention, in the image-capturing device according to the 4th aspect, it is preferred that the focus detection unit detects the focusing condition of the imaging optical system in the predetermined array direction based upon output signals from at least one plurality of the third pixels of a plurality of the third pixels included in the first set and the second set, respectively, and a plurality of the third pixels included in the third set and the fourth set, respectively, in the upper layer pixel group.

According to the 10th aspect of the present invention, in the image-capturing device according to the 4th aspect, it is preferred that the focus detection unit detects the focusing condition of the imaging optical system in the direction perpendicular to the predetermined array direction based upon output signals from at least one plurality of the third pixels of a plurality of the third pixels included in the first set and the third set, respectively, and a plurality of the third pixels included in the second set and the fourth set, respectively, in the upper layer pixel group.

According to the 11th aspect of the present invention, in the image-capturing device according to the 4th aspect, it is preferred that the focus detection unit detects the focusing condition of the imaging optical system in a direction oblique to the predetermined array direction based upon output signals from at least one plurality of the third pixels of a plurality of the third pixels included in the first set and the fourth set, respectively, and a plurality of the third pixels included in the second set and the third set, respectively, in the upper layer pixel group.

According to the 12th aspect of the present invention, an image sensor comprises: a first image-capturing unit that includes a plurality of microlenses arranged in a two-dimensional pattern; and a plurality of light reception units that are provided in correspondence to each of the microlenses, respectively, and that receive light having a predetermined wavelength and transmit lights having wavelengths different from the predetermined wavelength; and a second image-capturing unit that receives the lights that are transmitted through the first image-capturing units.

According to the 13th aspect of the present invention, in the image sensor according to the 12th aspect, it is preferred that the first imaging unit includes light reception units that are arranged adjacent to each other so as to be provided in correspondence to adjacent two of the microlenses and that absorb light having same wavelength corresponding to the predetermined wavelength.

Advantageous Effect of Invention

According to the present invention, image signal generation and focus detection according to a phase detection method can be performed based upon output signals from the image sensor without providing the image sensor with pixels dedicated for focus detection.

BRIEF DESCRIPTION OF DRAWINGS

FIG. 2 A plan view illustrating by an example the layout of pixels in an upper photoelectric conversion layer.

FIG. 3 A plan view illustrating by an example the layout of pixels in a lower photoelectric conversion layer.

FIG. 14 A diagram illustrating second image signal generation processing.

FIG. 15 A diagram illustrating third image signal generation processing.

FIG. 17 A diagram illustrating third image signal generation processing.

DESCRIPTION OF EMBODIMENTS

Figure 1:
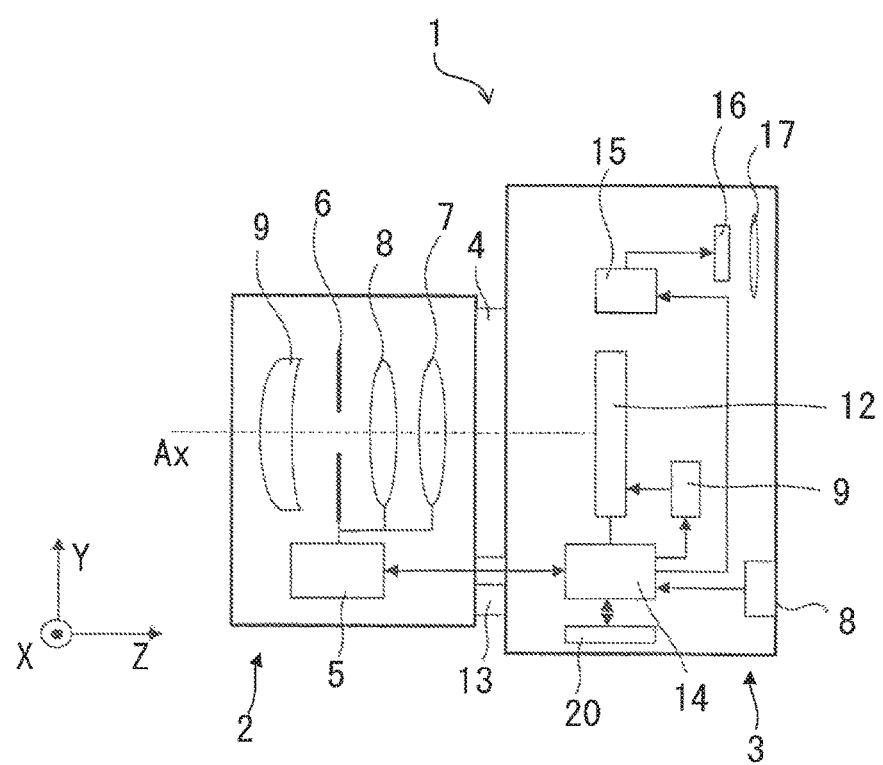
FIG. 1 A diagram illustrating by an example the configuration of a digital camera system according to an embodiment of the present invention.

Hereinafter, an embodiment of the present invention is described with reference to the attached drawings. FIG. 1 presents a diagram illustrating by an example the configuration of a digital camera system according to an embodiment of the present invention. A digital camera system 1 includes an interchangeable lens 2 and a camera body 3. The interchangeable lens 2 is mounted on the camera body 3 via a mount unit 4.

The interchangeable lens 2 includes a lens control unit 5, a main lens 9, a zoom lens 8, a focusing lens 7, and a diaphragm 6. The lens control unit 5 includes a microcomputer, a memory and so on and performs drive control of the focusing lens 7 and the diaphragm 6, detection of an open state of the diaphragm 6, detection of positions of the zoom lens 8 and the focusing lens 7, transmission of information about lens to a body control unit 14 on the side of the camera body 3 described later, reception of information about camera from the body control unit 14, and so on.

The camera body 3 includes an image sensor 12, an image sensor drive control unit 19, the body control unit 14, a liquid crystal display element drive circuit 15, a liquid crystal display element 16, an ocular lens 17, an operating member 18 and so on. A detachable memory card 20 is attached to the camera body 3. The image sensor 12 is arranged on a predetermined imaging plane of the interchangeable lens 2 and captures an image of a photographic subject that is formed by the interchangeable lens 2.

The body control unit 14 includes a microcomputer, a memory and so on. The body control unit 14 controls operations of the digital camera system in whole. The body control unit 14 and the lens control unit 5 are configured to communicate with each other via an electric contact unit 13 of the mount unit 4.

The image sensor drive control unit 19 generates a control signal that is necessary for the image sensor 12 in response to a command from the body control unit 14. The liquid crystal display element drive circuit 15 drives the liquid crystal display element 16 that constitutes a liquid crystal view finder (EVF: electric view finder) in response to a command from the body control unit 14. The photographer observes an image displayed on the liquid crystal display element 16 through the ocular lens 17. The memory card 20 is a storage medium in which image signals and the like are stored.

The image of the photographic subject formed on the image sensor 12 by the interchangeable lens 2 is subjected to photoelectric conversion by the image sensor 12. The image sensor 12 is controlled by a control signal from the image sensor drive control unit 19 with respect to timing (frame rate) of storage of photoelectric conversion signals and of reading of signals. The image signals read out from the image sensor 12 are converted in an A/D conversion unit (not shown) into digital data, which then is transmitted to the body control unit 14.

The body control unit 14 calculates a defocus amount on the basis of image signals from the image sensor 12 corresponding to predetermined focus detection areas, respectively, and transmits the calculated defocus amount to the lens control unit 5. The lens control unit 5 calculates a focusing lens drive amount on the basis of the defocus amount received from the body control unit 14 and drives the focusing lens 7 by a motor or the like, which is not shown, to move the focusing lens 7 to a focusing position on the basis of the calculated lens drive amount.

The body control unit 14 generates image data to be recorded on the basis of a signal that is output from the image sensor 12 after shooting is commanded. The body control unit 14 stores the generated image data in the memory card 20 and at the same time transmits the generated image data to the liquid crystal display element drive circuit 15 and controls it to be reproduced and displayed on the liquid crystal display element 16.

It is to be noted that the camera body 3 is provided with the operating member 18 that includes a shutter button and a setting member for setting a focus detection area or areas and so on. The body control unit 14 detects an operating signal from the operating member 18 and controls the operations (photographing processing, setting of a focus detection area and so on) in response to the result of the detection.

<Description of Image Sensor>

Since the present embodiment is featured by the image sensor 12, further description is focused on the image sensor 12. The image sensor 12 has a stacked structure, in which an upper photoelectric conversion layer 41 (FIG. 4) and a lower photoelectric conversion layer 43 (FIG. 4) are stacked one above another. The upper photoelectric conversion layer 41 is constituted by a photoconductive film that absorbs (photoelectrically converts) light having wavelength components described later and light having wavelength components not absorbed (photoelectrically converted) by the upper photoelectric conversion layer 41 is transmitted to the lower photoelectric conversion layer 43, where the transmitted light is photoelectrically converted.

(Upper Photoelectric Conversion Layer)

FIGS. 2(a) and (b) presents plan views each illustrate by an example the layout of pixels in the upper photoelectric conversion layer 41 of the image sensor 12. In this case, 10×10 pixels, which are extracted as representatives, are shown. The extracted pixels are laid out in a substantially square form and arranged in a two-dimensional pattern. The extracted pixels include three types of pixels, i.e., a pixel that photoelectrically converts light of a cyan (Cy) color component (Cy pixel), a pixel that photoelectrically converts light of a magenta (Mg) color component (Mg pixel), and a pixel that photoelectrically converts light of a yellow (Ye) color component (Ye pixel).

The Cy pixel is constituted by a photoelectric conversion unit that absorbs (photoelectrically converts) the light of the cyan color component. The Mg pixel is constituted by a photoelectric conversion unit that absorbs (photoelectrically converts) the light of the magenta color component. The Ye pixel is constituted by a photoelectric conversion unit that absorbs (photoelectrically converts) the light of the yellow color component.

In addition, the image sensor 12 is formed of a plurality of microlenses 40 each of which is to efficiently guide light fluxes from the interchangeable lens 2 to a set of four pixels. In FIG. 2, 5×5=25 circles correspond to the microlenses 40. The microlenses 40, each constituted by a spherical lens of axial symmetry whose center substantially coincides with its optical axis or a nonspherical lens, are arranged in a two-dimensional pattern, with the light incident side thereof having a convex shape.

Behind each of the microlenses 40, one Cy pixel, two Mg pixels and one Ye pixel are arranged in a two-by-two matrix. In the description of the present invention herein, a plurality of sets of four pixels positioned behind the corresponding microlenses 40, respectively, are classified into four types (P1 through P4) according to differences in their arrangements as shown in FIG. 2(*a*).

Behind the microlenses 40, first sets P1 each include a Cy pixel at a left upper position, an Mg pixel at a right upper position, an Mg pixel at a left lower position, and a Ye pixel at a right lower position. Second sets P2 each include an Mg pixel at a left upper position, a Cy pixel at a right upper position, a Ye pixel at a left lower position, and an Mg pixel at a right lower position. Third sets P3 each include an Mg pixel at a left upper position, a Ye pixel at a right upper position, a Cy pixel at a left lower position, and an Mg pixel at a right lower position. Fourth sets P4 each include a Ye pixel at a left upper position, an Mg pixel at a right upper position, an Mg pixel at a left lower position, and a Cy pixel at a right lower position.

The first sets P1 and the second sets P2 are adjacent to each other in a horizontal direction (X direction) and arranged alternately in a repeated manner in the horizontal direction. A line formed by the first sets P1 and the second sets P2 is called a "first line L1". The third sets P3 and the fourth sets P4 are adjacent to each other in the horizontal direction and are arranged alternately in a repeated manner in the horizontal direction. A line formed by the third sets P3 and the fourth sets P4 is called a "second line L2".

The first line L1 and the second line L2 described above are adjacent to each other in a vertical direction (Y direction) and are alternately arranged in a repeated manner in the vertical direction. With this configuration, each of the first sets P1 and each of the third sets P3 are adjacent to each other in the vertical direction, whereas each of the second sets P2 and each of the fourth sets P4 are adjacent to each other in the vertical direction.

With such an arrangement, the microlenses 40 and the Cy pixels, the Mg pixels, and the Ye pixels have the following positional relationships.

First, the Cy pixels, behind four microlenses 40 adjacent to each other in the horizontal direction and in the vertical direction, are arranged at a left upper position, a right upper position, a left lower position, and a right lower position, respectively. The Mg pixels, behind four microlenses 40 adjacent to each other in the horizontal direction and in the vertical direction, are arranged at right upper and left lower positions, left upper and right lower positions, left upper and right lower positions, and right upper and left lower positions, respectively. The Ye pixels, behind four microlenses 40 adjacent to each other in the horizontal direction and in the vertical direction, are arranged at a right lower position, a left lower position, a right upper position, and a left upper position, respectively. In this manner, the Cy pixels, the Mg pixels, and the Ye pixels are uniformly arranged behind the microlenses 40 without being arranged disproportionately to specific positions.

FIG. 2(*b*) is a diagram showing a part extracted from the upper photoelectric conversion layer of the image sensor, which part is similar to that shown in FIG. 2(*a*). When four sets of pixels (P1 through P4) shown in FIG. 2(*a*) are viewed by shifting them by 1 pixel both in the horizontal direction and in the vertical direction, the Cy, Mg and Ye pixels each are arranged such that adjacent four pixels in any particular two-by-two matrix have the same color as shown in FIG. 2(*b*).

In addition, the four pixels in any particular two-by-two matrix having the same color are arranged behind different microlenses 40, respectively, so that they assume different positions with respect to the microlenses 40. In other words, the Cy, Mg and Ye pixels arranged behind the four microlenses 40, respectively, are arranged such that they are adjacent to each other in a two-by-two matrix for each color.

(Lower Photoelectric Conversion Layer)

FIGS. 3(*a*) and (*b*) presents plan views each illustrate by an example the layout of pixels in the lower photoelectric conversion layer 43 (FIG. 4) of the image sensor 12. In this case, 10×10 pixels, which correspond to the positions of the pixels exemplified in FIG. 2, are shown. These pixels are laid out in a substantially square form and arranged in a two-dimensional pattern. They include three types of pixels, i.e., a pixel that photoelectrically converts light of a red (R) color component (R pixel), a pixel that photoelectrically converts light of a green (G) color component (G pixel), and a pixel that photoelectrically converts light of a blue (B) color component (B pixel).

The R pixel is constituted by a photoelectric conversion unit that photoelectrically converts light of the red color component (i.e., a complementary color of Cy) that has not been absorbed (photoelectrically converted) by the Cy pixel lying above. The G pixel is constituted by a photoelectric conversion unit that photoelectrically converts light of the green color component (i.e., a complementary color of Mg) that has not been absorbed (photoelectrically converted) by the Mg pixel lying above. The B pixel is constituted by a photoelectric conversion unit that photoelectrically converts light of the blue color component (i.e., complementary color of Ye) that has not been absorbed (photoelectrically converted) by the Ye pixel lying above. In other words, the Cy, Mg and Ye pixels in the upper photoelectric conversion layer 43 constitute R, G and B light reception units, respectively, that serve as color filters.

As a result, each of sets (referred to as Q1) underlying the first sets P1, respectively, includes an R pixel at a left upper position, a G pixel at a right upper position, a G pixel at a left lower position, and a B pixel at a right lower position. Each of sets (referred to as Q2) underlying the second sets P2, respectively, includes a G pixel at a left upper position, an R pixel at a right upper position, a B pixel at a left lower position, and a G pixel at a right lower position. Each of sets (referred to as Q3) underlying the third sets P3, respectively, includes a G pixel at a left upper position, a B pixel at a right upper position, an R pixel at a left lower position, and a G pixel at a right lower position. Each of sets (referred to as Q4) underlying the fourth sets P4, respectively, includes a B pixel at a left upper position, a G pixel at a right upper position, a G pixel at a left lower position, and an R pixel at a right lower position.

With such an arrangement, the microlenses 40 and the R pixels, the G pixels, and the B pixels have the following positional relationships.

First, the R pixels, behind four microlenses 40 that are adjacent to each other in the horizontal direction and in the vertical direction, are arranged at a left upper position, a right upper position, a left lower position, and a right lower position, respectively. The G pixels, behind four microlenses 40 that are adjacent to each other in the horizontal direction and in the vertical direction, are arranged at right upper and left lower positions, left upper and right lower positions, left upper and right lower positions, and right upper and left lower positions, respectively. The B pixels, behind four microlenses 40 that are adjacent to each other in the horizontal direction and in the vertical direction, are arranged at a right lower position, a left lower position, a right upper position, and a left upper position, respectively. In this manner, the R pixels, the G pixels, and the B pixels are uniformly arranged behind the microlenses 40 without being arranged disproportionately to specific positions.

FIG. 3(b) is a diagram showing a part extracted from the lower photoelectric conversion layer of the image sensor, which part is similar to that shown in FIG. 3(a). When four sets of pixels (Q1 through Q4) shown in FIG. 3(a) are viewed by shifting them by 1 pixel both in the horizontal direction and in the vertical direction, the R, G and B pixels each are arranged such that adjacent four pixels in any particular two-by-two matrix have the same color as shown in FIG. 3(b).

In addition, the four pixels in any particular two-by-two matrix having the same color are arranged behind different microlenses 40, respectively, so that they assume different positions with respect to the microlenses 40. In other words, the R, G and B pixels arranged behind the four microlenses 40, respectively, are arranged such that they are adjacent to each other in a two-by-two matrix for each color.

The sets constituted by four pixels in a two-by-two matrix of the same color, i.e., a set 50r constituted by four R pixels, a set 50g constituted by four G pixels, and a set 50b constituted by four B pixels, when the four pixels are viewed as one set, each form a Bayer arrangement.

Figure 4:
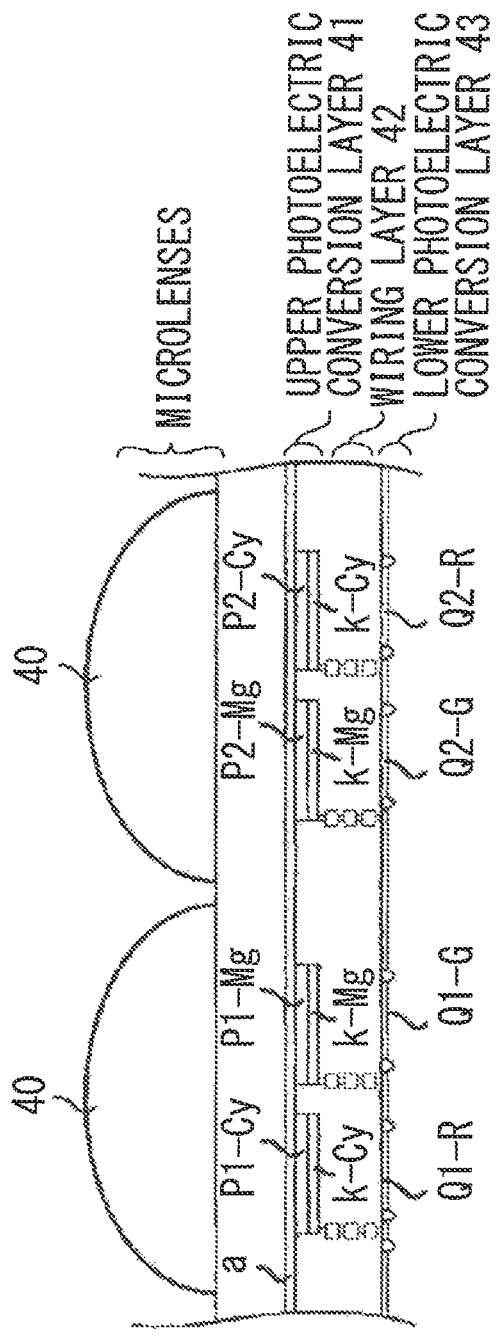
FIG. 4 A diagram illustrating by an example a cross-section of an image sensor.

FIG. 4 presents a diagram illustrating by an example a cross-section of the image sensor 12. In FIG. 4, the image sensor 12 includes the lower photoelectric conversion layer 43 formed on a silicone substrate and the upper photoelectric conversion layer 41 stacked on the lower photoelectric conversion layer 43 via a wiring layer 42. Above the upper photoelectric conversion layer 41 are formed the microlenses 40.

The upper photoelectric conversion layer 41 includes electrodes and photoconductive films each sandwiched by the electrodes to constitute the Cy, Mg and Ye pixels. For instance, an upper electrode a and a lower electrode k-Cy sandwich therebetween a photoconductive film P1-Cy to constitute a Cy pixel in the first set P1. In addition, for instance, the upper electrode a and a lower electrode k-Mg sandwich therebetween a photoconductive film P2-Mg to constitute an Mg pixel in the second set P2.

The lower photoelectric conversion layer 43 is constituted by the R pixel, the G pixel, and the B pixel on a silicone substrate and photoelectrically converts light that enters each of the pixels. In FIG. 4, the R pixel in the first set Q1 receives complementary light (R) that is transmitted through the Cy pixel in the first set P1 of the upper photoelectric conversion layer 41. In addition, the G pixel in the second set Q2 receives complementary light (G) that is transmitted through the Mg pixel in the second set P2 of the upper photoelectric conversion layer 41.

Figure 5:
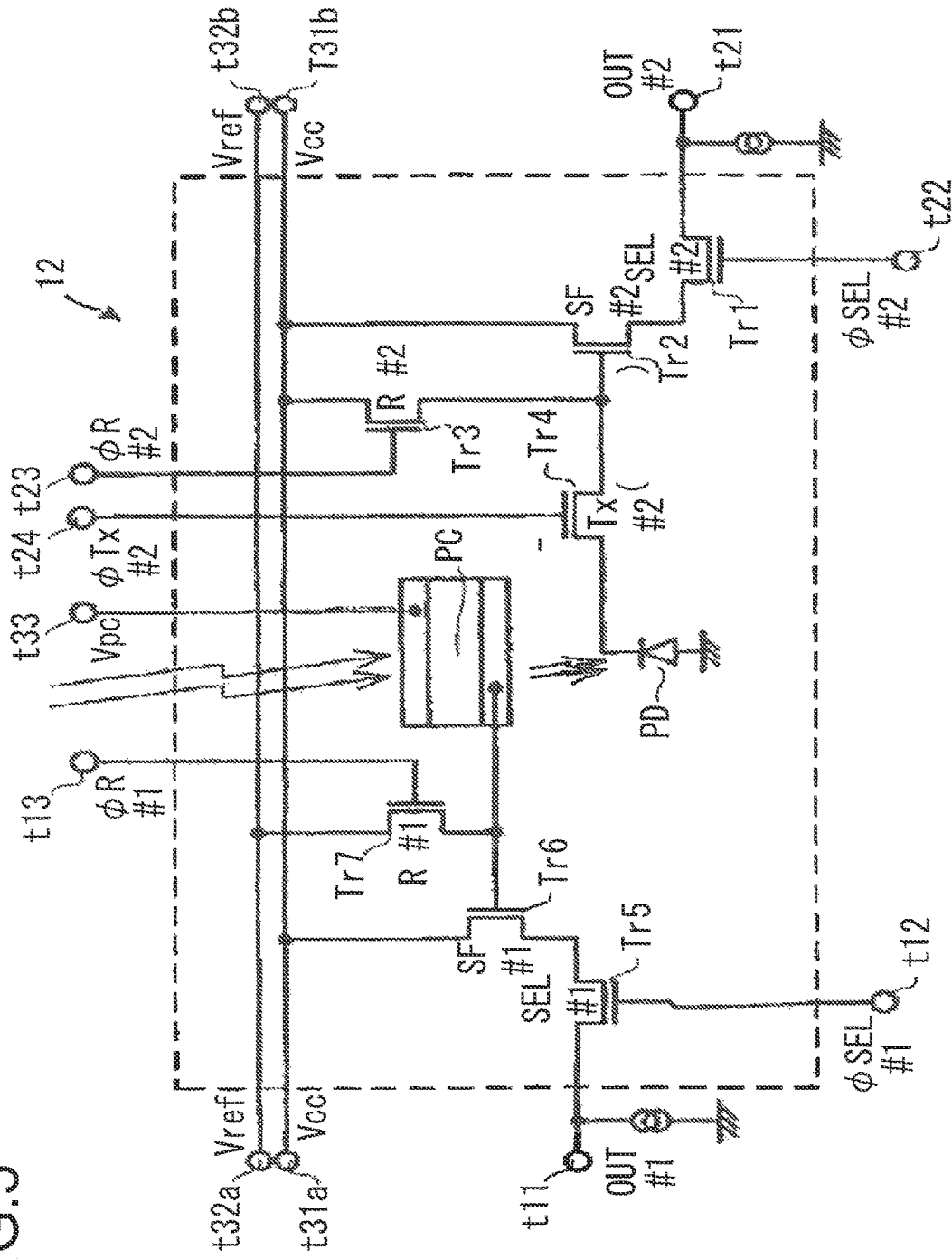
FIG. 5 A diagram illustrating by an example a circuit configuration per pixel in the image sensor.

FIG. 5 illustrates by an example a circuit configuration per pixel in the image sensor 12. In FIG. 5, a reference voltage source Vref is provided to reference voltage source terminals t32a and t32b. In addition, a voltage source Vcc is provided to the voltage source terminals t31a and t31b. Furthermore, a voltage source Vpc is provided from a terminal t33 to a PC (photoconductor) 20.

A signal detection unit of the upper photoelectric conversion layer 41 has the following configuration. The PC 20 constitutes a photoelectric conversion unit for one pixel of the upper photoelectric conversion layer 41. In the PC 20, incident light is photoelectrically converted into a charge, so that charges are accumulated therein. A source follower amplifier MOS transistor Tr6 amplifies a voltage signal based upon the accumulated charges. A transfer switch MOS transistor Tr5 constitutes a switch for selecting a target pixel to be read out. When a control pulse signal φSEL#1 that turns on/off the transfer switch MOS transistor Tr5 is provided to a terminal t11, an amplified signal is read out from the terminal t11 via the transfer switch MOS transistor Tr5. A reset MOS transistor Tr7 discharges unnecessary charges in response to a reset pulse signal φR#1 provided to a terminal t13 (in other words, resets to a predetermined potential).

A signal detection unit of the lower photoelectric conversion layer 43 has the following configuration. A photodiode PD constitutes a photoelectric conversion unit for one pixel of the lower photoelectric conversion layer 43. The photodiode PD photoelectrically converts light that is transmitted through the PC 20 to generate charges. The photodiode PD and a floating diffusion (FD) unit are connected with each other through the transfer MOS transistor Tr4. When a control pulse signal φTx#2 that turns on/off the transfer switch MOS transistor Tr4 is provided to a terminal t24, charges are transferred to the floating diffusion unit via the transfer MOS transistor Tr4.

A source follower amplifier MOS transistor Tr2 amplifies a voltage signal based upon the accumulated charges. A transfer switch MOS transistor Tr1 constitutes a switch for selecting a target pixel to be read out. When a control pulse signal φSEL#2 that turns on/off the transfer switch MOS transistor Tr1 is provided to a terminal t22, an amplified signal is read out from a terminal t21 via the transfer switch MOS transistor Tr1. A reset MOS transistor Tr3 discharges unnecessary charges in the floating diffusion unit in response to a reset pulse signal φR#1 provided to a terminal t13 (in other words, resets it to a predetermined potential).

<Focus Detection Processing>

Figure 6:
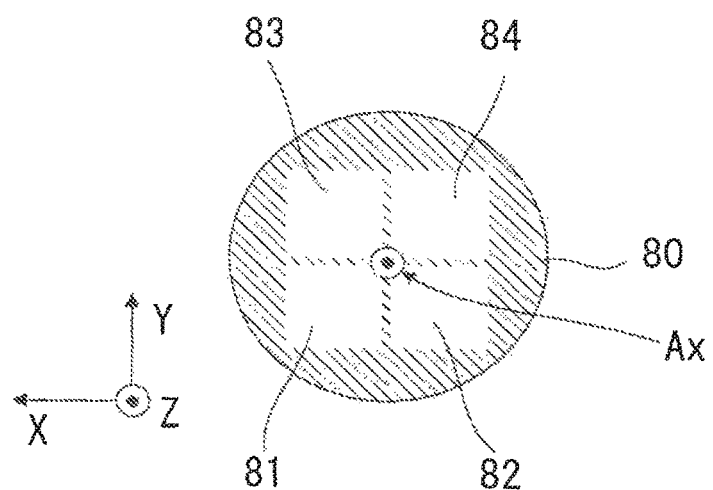
FIG. 6 A diagram illustrating by an example an exit pupil of an interchangeable lens.

Next, an example in which signals for focus detection are obtained from the image sensor 12 having the configuration described above is described referring to FIG. 6 through FIG. 12. FIG. 6 presents a diagram illustrating by an example an exit pupil 80 of the interchangeable lens 2 in a state in which the diaphragm is open. Light fluxes that have passed through four regions 81 through 84 of the exit pupil 80 enter pixels located at positions corresponding to a left upper part, a right upper part, a left lower part, and a right lower part, respectively, of each of the microlenses 40 in FIG. 2. For each of the microlenses 40, correspondence relationship between the light fluxes that enter the pixels located at positions corresponding to the left upper, right upper, left lower, and right lower parts of the microlens and the first region 81, the second region 82, the third region 83, and the fourth region 84, respectively, of the exit pupil 80 may be considered such that the up and down relation as well as the left and right relation are inverted with respect to the light axis Ax of the interchangeable lens 2 as an axis of symmetry.

Figure 7:
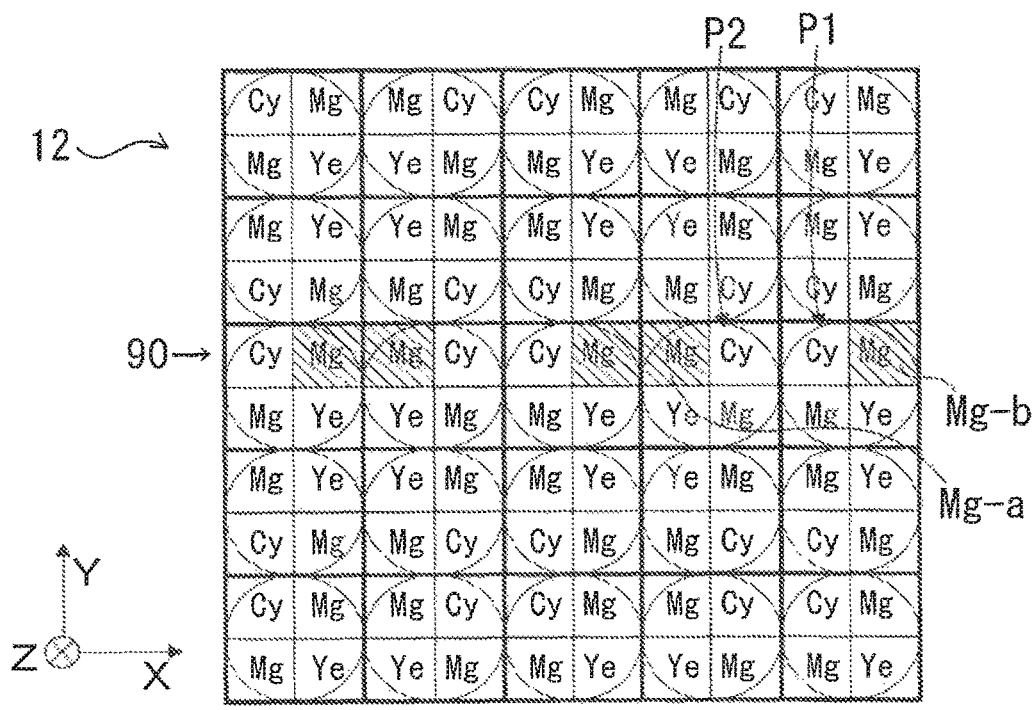
FIG. 7 A diagram illustrating pixel rows for obtaining a defocus amount.
Figure 8:
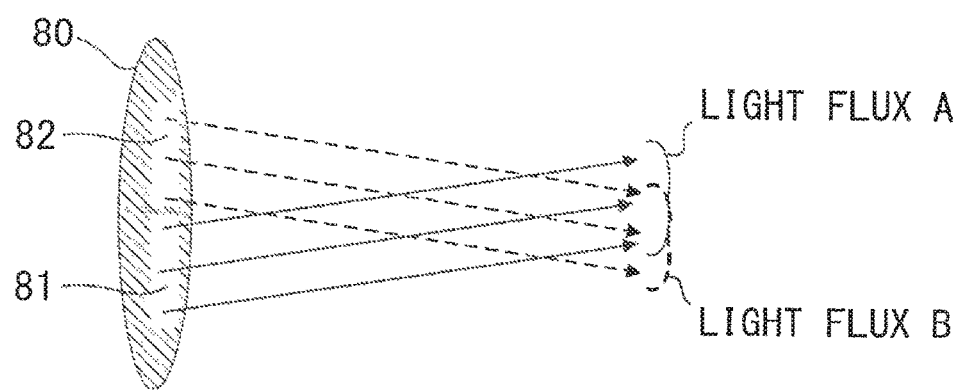
FIG. 8 A diagram illustrating light fluxes passing through the exit pupil.

First, as exemplified in FIG. 7, explanation is made on a case in which the defocus amount is obtained based on a pixel row 90, in which Mg pixels out of the pixels in the image sensor 12 are arranged in the horizontal direction (X axis direction). The pixel row 90 is constituted by an Mg pixel (Mg-a) that is included in each second set P2 and located at the left upper position of each microlens 40 and an Mg pixel (Mg-b) that is included in each first set P1 and located at the right upper position of each microlens 40. As exemplified in FIG. 8, a light flux A that pass through a first region 81 on the exit pupil 80 and a light flux B that pass through a second region 82 on the exit pupil 80 enter the pixels that constitute the pixel row 90. The light flux A enters the Mg pixel (Mg-a) located at the left upper position of each microlens 40. The light flux B enters the Mg pixel (Mg-b) located at the right upper position of each microlens 40.

Upon focusing, the image sensor 12 is in a state in which a sharp image is formed, so that as described above, a pair of images formed by light fluxes through different positions of the pupil as a result of pupil-splitting coincide with each other on the image sensor 12. In other words, in the pixel row 90, a signal waveform (signal sequence a1, a2, a3, a4, . . . ) obtained from the Mg pixels (Mg-a) that receive the light fluxes A and a signal waveform (signal sequence b1, b2, b3, b4, . . . ) obtained from the Mg pixels (Mg-b) that receive the light fluxes B overlap in their shape.

On the other hand, upon non-focusing, i.e., in a state in which a sharp image is formed on the front side or on the rear side of the image sensor 12, a pair of images formed by the light fluxes subjected to the pupil-splitting do not coincide with each other on the image sensor 12. In this case, the signal waveform (signal sequence a1, a2, a3, a4 . . . ) by the light fluxes A and the signal waveform (signal sequence b1, b2, b3, b4, . . . ) by the light fluxes B have different positional relationships (deviation direction and deviation amount) therebetween according to a deviation (defocus amount) from the focused state.

The body control unit 14 calculates the focusing condition (defocus amount) of the focus position by the interchangeable lens 2 on the basis of the positional relationship between the signal waveform (signal sequence a1, a2, a3, a4 . . . ) by the light fluxes A and the signal waveform (signal sequence b1, b2, b3, b4, . . . ) by the light fluxes B and transmits the result of calculation that serves as camera information to the lens control unit 5. As the lens control unit 5 moves the focusing lens 7 back and forth along the optical axis direction on the basis of the camera information, the focus is adjusted so that a sharp image can be formed on the image sensor 12.

Figure 9:
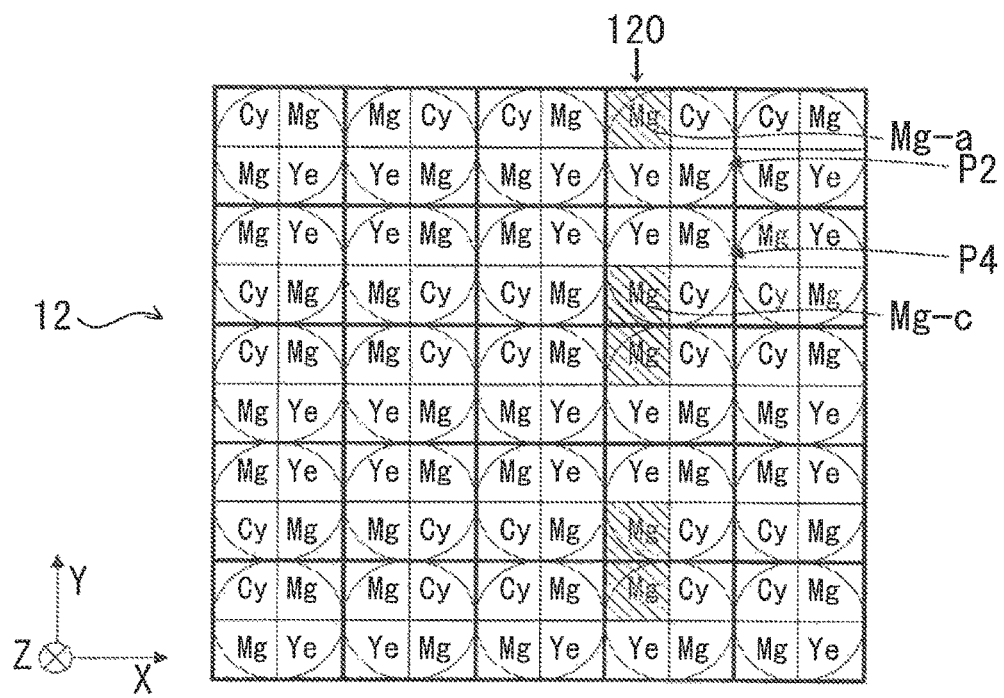
FIG. 9 A diagram illustrating pixel rows used for obtaining a defocus amount.
Figure 10:
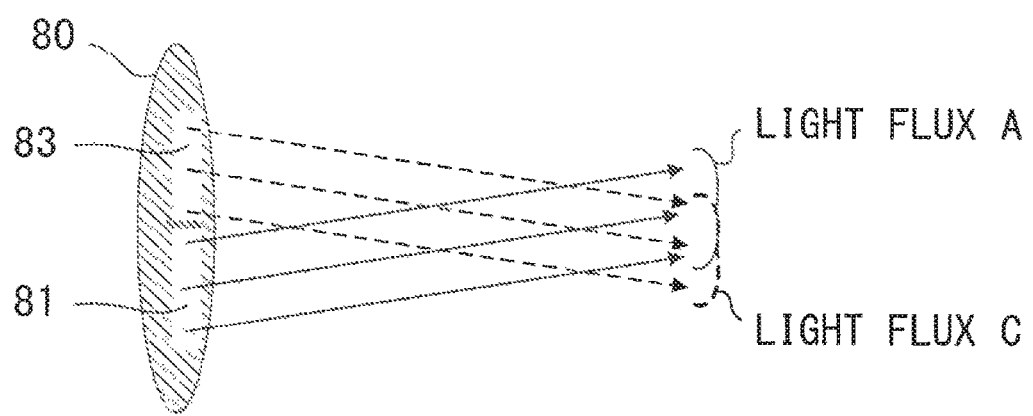
FIG. 10 A diagram illustrating light fluxes passing through the exit pupil.

Next, explanation is made on a case in which the defocus amount is obtained based upon a pixel row 120 in which Mg pixels out of the pixels in the image sensor 12 are arranged in the vertical direction (Y axis direction) as exemplified in FIG. 9. The pixel row 120 is constituted by an Mg pixel (Mg-a) that is included in each second set P2 and located at the left upper position of the each microlens 40 and an Mg pixel (Mg-b) that is included in each fourth set P4 and located at the left lower position of each microlens 40. As shown in FIG. 10, the light flux A that passes through the first region 81 on the exit pupil 80 and a light flux C that passes through a third region 83 on the exit pupil 80 enter the pixels that constitute the pixel row 120. The light flux A enters the Mg pixel (Mg-a) located at the left upper position of each microlens 40. The light flux C enters the Mg pixels (Mg-c) located at the left lower position of each microlens 40.

Upon focusing, the image sensor 12 is in a state in which a sharp image is formed therein, so that in the pixel row 120 as described above, a signal waveform (signal sequence a1, a2, a3, a4, . . . ) obtained from the Mg pixels (Mg-a) that receive the light fluxes A and a signal waveform (signal sequence c1, c2, c3, c4, . . . ) obtained from the Mg pixels (Mg-c) that receive the light fluxes C overlap in their shape.

On the other hand, upon non-focusing, the signal waveform (signal sequence a1, a2, a3, a4 . . . ) provided by the light fluxes A and the signal waveform (signal sequence c1, c2, c3, c4, . . . ) provided by the light fluxes C have positional relationships (deviation direction and deviation amount) therebetween which are different from each other according to a deviation (defocus amount) from the focused state.

The body control unit 14 calculates the focusing condition (defocus amount) at the focus position achieved by the interchangeable lens 2 on the basis of the positional relationship between the signal waveform (signal sequence a1, a2, a3, a4 . . . ) provided by the light fluxes A and the signal waveform (signal sequence c1, c2, c3, c4, . . . ) provided by the light fluxes C and transmits the result of calculation that serves as camera information to the lens control unit 5. As the lens control unit 5 moves the focusing lens 7 back and forth along the optical axis direction on the basis of the camera information, the focus is adjusted so that a sharp image can be formed on the image sensor 12.

Figure 11:
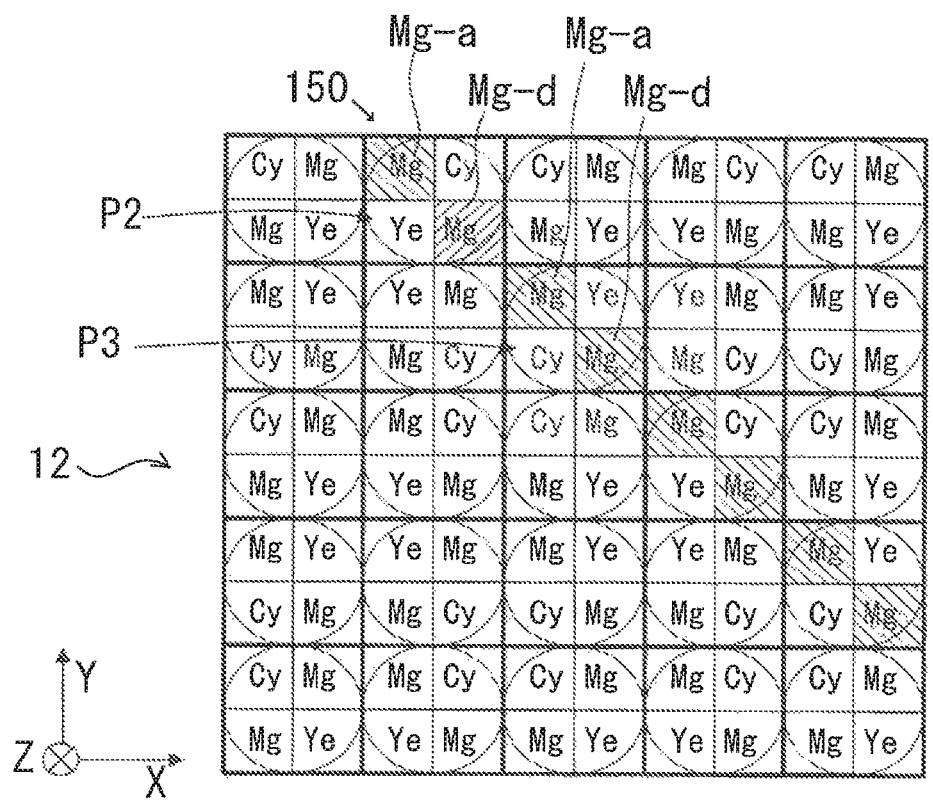
FIG. 11 A diagram illustrating pixel rows used for obtaining a defocus amount.
Figure 12:
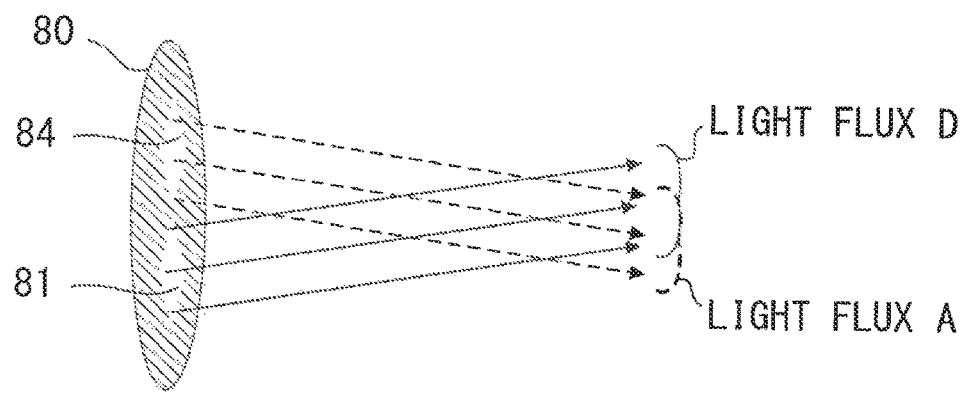
FIG. 12 A diagram illustrating light fluxes passing through the exit pupil.

In addition, explanation is made on a case in which the defocus amount is obtained on the basis of a pixel row 150 constituted by Mg pixels out of the pixels in the image sensor 12 that are arranged in an oblique direction as exemplified in FIG. 11. The pixel row 150 is constituted by an Mg pixel (Mg-a) included in each second set P2 and located at the left upper position of each microlens 40, an Mg pixel (Mg-d) included in each second set P2 and located at the right lower position of each microlens 40, an Mg pixel (Mg-a) included in each third set P3 and located at the left upper position of each microlens 40, and an Mg pixel (Mg-d) included in each third set P3 and located at the right lower position of each microlens 40. As shown in FIG. 12, the light flux A that passes through the first region 81 on the exit pupil 80 and a light flux D that passes through a fourth region 84 on the exit pupil 80 enter the pixels that constitute the pixel row 150. The light flux A enters the Mg pixel (Mg-a) located at the left upper position of each microlens 40. The light flux D enters the Mg pixel (Mg-d) located at the right lower part of each microlens 40.

Upon focusing, the image sensor 12 is in a state in which a sharp image can be formed therein, so that in the pixel row 150 as described above, a signal waveform (signal sequence a1, a2, a3, a4, . . . ) obtained from the Mg pixels (Mg-a) that receive the light fluxes A and a signal waveform (signal sequence c1, c2, c3, c4, . . . ) obtained from the Mg pixels (Mg-c) that receive the light fluxes C overlap in their shape.

On the other hand, upon non-focusing, the signal waveform (signal sequence a1, a2, a3, a4 . . . ) provided by the light fluxes A and the signal waveform (signal sequence d1, d2, d3, d4, . . . ) provided by the light fluxes D have positional relationships (deviation direction and deviation amount) therebetween, which are different from each other, according to the deviation (defocus amount) from the focused state.

The body control unit 14 calculates the focusing condition (defocus amount) of the focus position by the interchangeable lens 2 on the basis of the positional relationship between the signal waveform (signal sequence a1, a2, a3, a4 . . . ) provided by the light fluxes A and the signal waveform (signal sequence d1, d2, d3, d4, . . . ) provided by the light fluxes D and transmits the result of calculation that serves as camera information to the lens control unit 5. As the lens control unit 5 moves the focusing lens 7 back and forth along the optical axis direction on the basis of the camera information, the focus is adjusted so that a sharp image can be formed on the image sensor 12.

<Image Signal Generation Processing>

Next, explanation is made on an example in which image signals are obtained from the image sensor 12 referring to FIG. 13 through FIG. 17. In the present embodiment, any of the following three methods is used as image signal generation processing for generating a color image signal on the basis of output signals from the lower photoelectric conversion layer 43. The body control unit 14 executes image signal generation processing by a method indicated by an initial setting in advance.

(First Image Signal Generation Processing)

Figure 13:
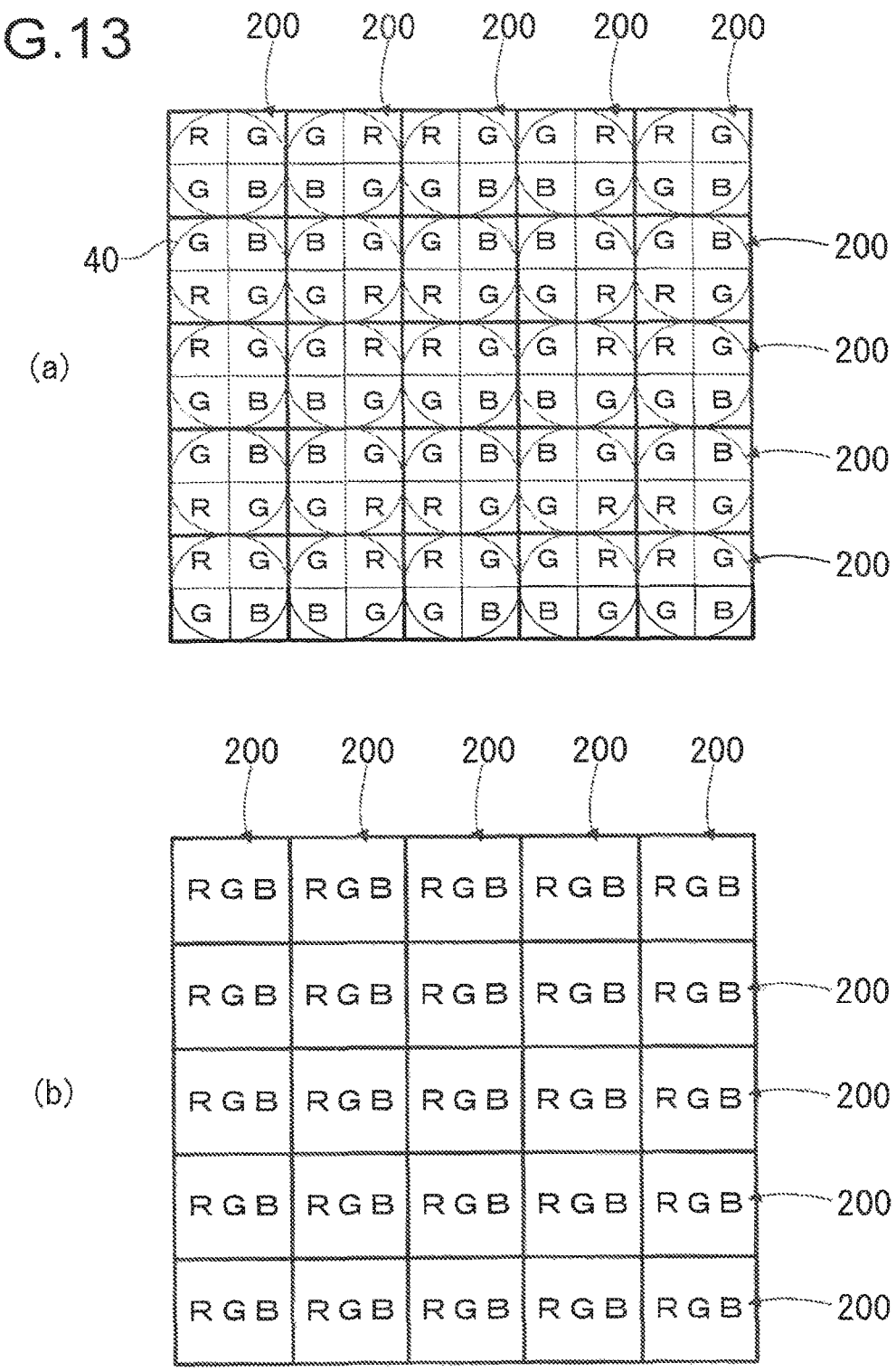
FIG. 13 A diagram illustrating first image signal generation processing.

FIG. 13 presents a diagram illustrating first image signal generation processing. The body control unit 14, which executes the first image signal generation processing, treats four pixels that receive light fluxes through the one and the same microlens 40 as one set 200, as shown in FIG. 13(a). Each of the sets 200 includes two G pixels, one B pixel and one R pixel.

The body control unit 14 treats, for any particular one of the sets 200, an output signal from the R pixel as an R image signal of the particular one set 200, an output signal from the B pixel as a B image signal of the particular one set 200, and an average value of output signals from the two G pixels as a G image signal of the particular one set 200. As a result, the body control unit 14 can obtain color image signals (RGB) in a number that is ¼ times the number of the pixels included in the lower photoelectric conversion layer 43 of the image sensor 12, as shown in FIG. 13(b). The body control unit 14 generates an image file for recording by using the thus-obtained color image signals.

As described above, in the first image signal generation processing, color image signals can be obtained without executing color interpolation processing for interpolating color signals.

(Second Image Signal Generation Processing)

FIG. 14 presents a diagram illustrating second image signal generation processing. The body control unit 14, which executes the second image signal generation processing, treats adjacent four pixels in a two-by-two matrix having the same color as one set 210 as shown in FIG. 14(a).

The body control unit 14 treats a signal obtained by adding output signals from the four pixels included in any particular one of the sets 120 as an image signal of the particular set 210. Specifically, in the case of any particular one set 210 that is all constituted by R pixels, the body control unit 14 treats a signal obtained by adding output signals from the four R pixels as an R image signal of the particular one set 210. In the case of any particular one set 210 that is all constituted by G pixels, the body control unit 14 treats a signal obtained by adding output signals from the four G pixels as a G image signal of the particular one set 210. In the case of any particular one set 210 that is all constituted by B pixels, the body control unit 14 treats a signal obtained by adding output signals from the four B pixels as a B image signal of the particular one set 210. As a result, the body control unit 14 can obtain color image signals of a Bayer arrangement in a number that is ¼ times the number of the pixels included in the lower photoelectric conversion layer 43 of the image sensor 12, as shown in FIG. 14(b).

And now, depending on the angle of incidence of the light fluxes that enter each microlens 40 it may happen that the four pixels arranged behind each microlens 40 receive uneven amounts of light. For instance, at a certain incident angle θ1, the amount of light received by the pixel located at the left upper position of each microlens 40 is relatively large while the amount of light received by the pixel located at the right lower position of each microlens 40 is relatively small. At another incident angle θ2, the amount of light received by the pixel located at the left upper position of each microlens 40 is relatively small while the amount of light received by the pixel located at the right lower position of each microlens 40 is relatively large.

In the second image signal generation processing, as a signal obtained by adding output signals from four pixels located at positions corresponding to different positions (left upper, right upper, left lower, and right lower positions) of each microlens 40 (that is, four pixels included in any particular one set 210) is treated as an image signal of the particular one set 210, an optimal image signal can be generated independently of the incident angles of the light fluxes that enter the microlens 40.

In addition, the body control unit 14 generates, in an image signal of a Bayer arrangement in any particular one set 210, a color component that is in short by interpolation processing using signals from a plurality of other sets 210 that are adjacent to the particular one set 210. For instance, in the case of any particular one set 210 that is all constituted by G pixels, as there is present neither R image signal nor B image signal therefrom, color interpolation processing is executed by using signals from a plurality of other sets 210 that are circumjacent to the particular one set 210. Since such color interpolation processing in the Bayer arrangement is known in the art, detailed description thereof is omitted herein. The body control unit 14 generates a file for recording by using color image signals (RGB) obtained by executing this color interpolation processing.

(Third Image Signal Generation Processing)

The body control unit 14, which executes third signal generation processing, first executes color interpolation processing for interpolating a color component that is in short in each pixel.

FIG. 15 presents a diagram illustrating processing for interpolating a G image signal. The body control unit 14 generates, at a position of any particular one pixel out of the R pixels and the B pixels, a G image signal by using output signals from four G pixels located near the particular one pixel by interpolation processing. For instance, in case that a G image signal is to be interpolated at the position of the R pixel in a thick-frame in FIG. 15(a), output signals from four G pixels (G1 through G4) that are located near the particular R pixel are used. The body control unit 14 defines $(\alpha G1+\beta G2+\gamma G3+\delta G4)/4$ as a G image signal of the particular R pixel. It is to be noted that $\alpha$ through $\delta$ each are coefficients depending on the distances from the particular R pixel. The smaller the distance from the target pixel to be interpolated, the greater the coefficient is. In this case, as the G pixels G1 and G2 are closer to the particular R pixel than the G pixels G3 and G4 are, it is set that $\alpha=\beta>\gamma=\delta$.

In this manner, the body control unit 14 executes processing for interpolating G image signals at positions of R pixels and B pixels, so that a G image signal can be obtained at a position of each pixel 30 as shown in FIG. 15(b).

Figure 16:
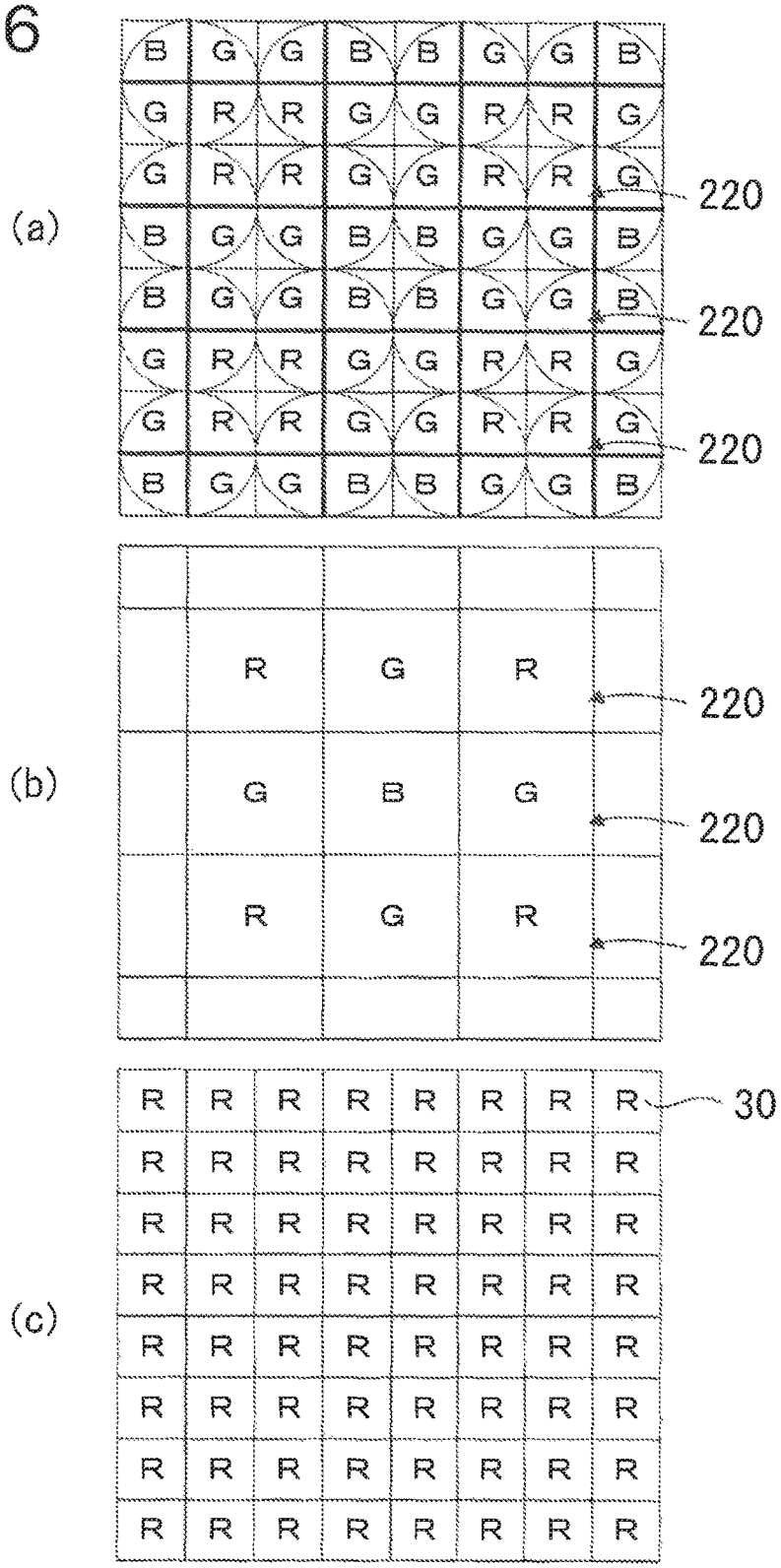
FIG. 16 A diagram illustrating third image signal generation processing.

FIG. 16 presents a diagram illustrating processing for interpolating R image signals. As shown in FIG. 16, the body control unit 14 treats four pixels constituted by adjacent four pixels in a two-by-two matrix having the same color as one set 220. The body control unit 14 defines a signal obtained by adding output signals from the four pixels in a particular one set 220 of R pixels to be an R image signal of the particular one set 220. The body control unit 14 interpolates R image signals in a particular one set 220 of G pixels and a particular one set 220 of B pixels using R image signals from a plurality of sets of R pixels that are circumjacent to the particular one set 220 of G pixels and the particular one set 220 of B pixels. Since the sets 220 each form a Bayer arrangement as shown in FIG. 16(b), the body control unit 14 can execute this interpolation processing by using color interpolation processing for Bayer arrangements that is known in the art.

The body control unit 14 defines an R image signal that is interpolated in a particular one set 220 of B pixels and divided by 4 (R/4) to be an R image signal for all the four G pixels that constitute the particular one set 220 of G pixels. Similarly, the body control unit 14 defines an R image signal that is interpolated in a particular one set 220 of B pixels and divided by 4 (R/4) to be an R image signal for all the four B pixels that constitute the particular one set 220 of B pixels. In this manner, the body control unit 14 can obtain an R image signal at the position of each of the pixels 30 by executing interpolation processing for interpolating R image signals at the positions of the G pixels and of the B pixels, as shown in FIG. 16(c).

It is to be noted that interpolation processing for interpolating B image signals is similar to the interpolation processing for interpolating R image signals, so that detailed description thereof is omitted here. The body control unit 14 can obtain a B image signal at the position of each of the pixels 30 by executing interpolation processing for interpolating B image signals at the positions of the R pixels and of the G pixels.

The body control unit 14 executes the color interpolation processing as described above to obtain an image signal of RGB at the position of each of the pixels 30 as shown in FIG. 17(a). In addition, the body control unit 14 obtains a luminance (brightness) signal Y at the position of each of the pixels 30 by using the image signal of RGB at the position of each of the pixels 30. For instance, the body control unit 14 defines 0.299R+0.587G+0.114B as a luminance signal Y.

In addition, the body control unit 14 defines a signal (R-Y) obtained by deducing the luminance signal Y from the R image signal at the position of each of the pixels 30 as a color difference (chrominance) signal Cr. The body control unit 14 defines a signal (B-Y) obtained by deducing the luminance signal Y from the B image signal at the position of each of the pixels 30 as a color difference (chrominance) signal Cb.

As a result, the body control unit 14 can obtain the luminance signal Y and the color difference signals Cr and Cb at the position of each of the pixels 30 as shown in FIG. 17(b). By using the color image signals (YCrCb) thus obtained, the body control unit 14 generates an image file for recording having a resolution higher than those generated according to the first image signal generation processing and the second image signal generation processing, respectively.

<Shooting Processing>

Figure 18:
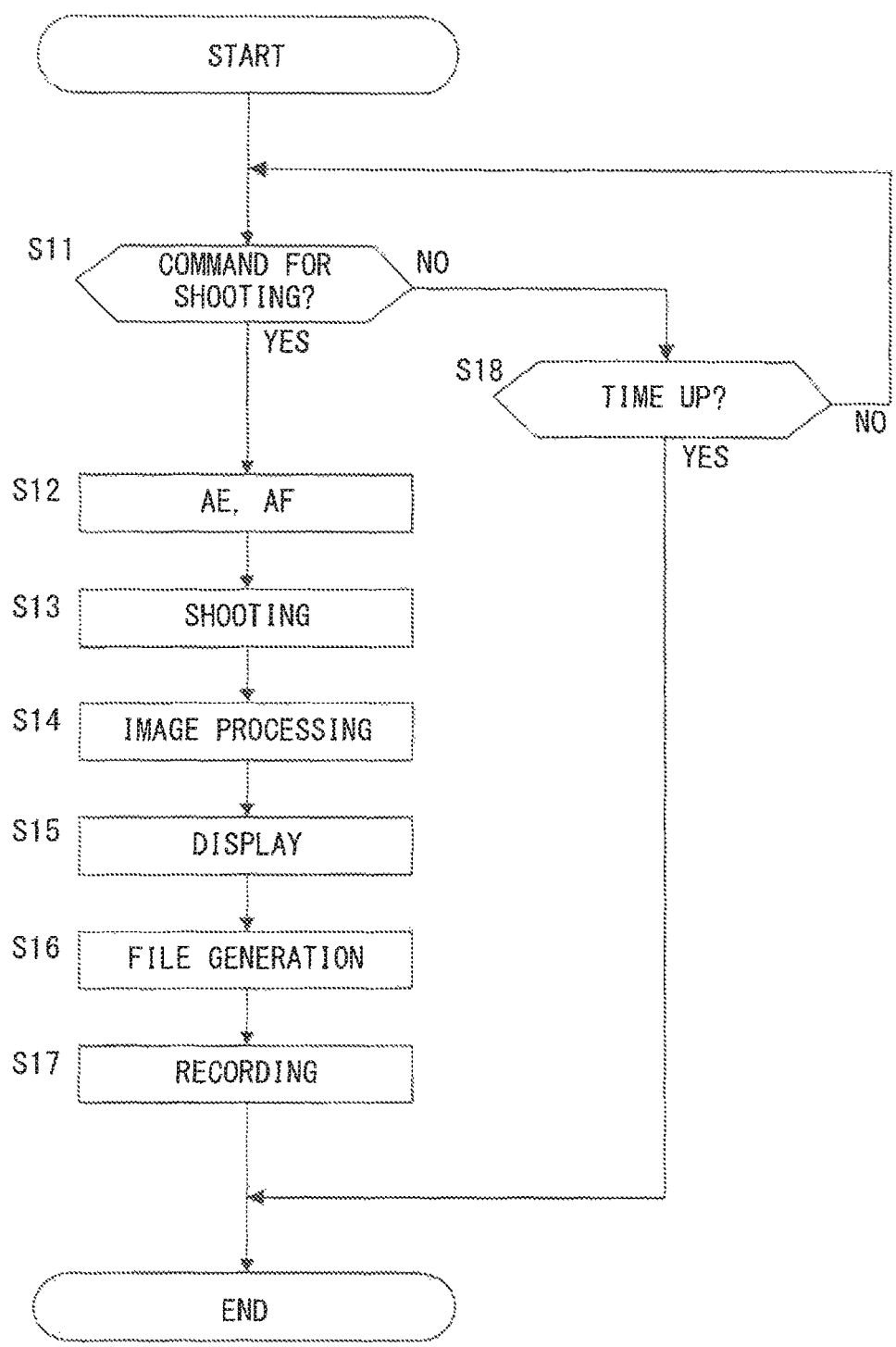
FIG. 18 A flowchart illustrating the flow of imaging processing.

FIG. 18 presents a flowchart illustrating the flow of imaging processing to be executed by the body control unit 14. The body control unit 14, when a main switch (not shown) that constitutes the operating member 18 is turned ON, starts up a program that executes the processing exemplified in FIG. 18.

In step S11 in FIG. 18, the body control unit 14 controls the image sensor 12 to start photoelectric conversion at a predetermined frame rate. The body control unit 14 makes a decision as to whether or not a command for shooting is issued while it controls the liquid crystal display element 16 to successively reproduce and display a through image based on the image signals from the lower photoelectric conversion layer 43. The through image is an image for monitoring that is obtained before shooting is commanded. When a release button that constitutes the operating member 18 is pushed down, the body control unit 14 makes a positive decision in step S11 and the program proceeds to step S12. When the release button is not pushed down, the body control unit 14 makes a negative decision in step S11 and the program proceeds to step S18.

In step S18, the body control unit 14 makes a decision as to whether or not time is up. When the body control unit 14 measures a predetermined time (for instance, 5 seconds), it makes a positive decision in step S18 and the processing in FIG. 15 is terminated. When the measured time is shorter than the predetermined time, the body control unit 14 makes a negative decision in step S18 and the program returns to step S11.

In step S12, the body control unit 14 executes AE processing and AF processing. In the AE processing, exposure is calculated on the basis of the level of image signal for the through image in order to decide aperture value AV and shutter speed TV so that optimal exposure can be obtained. In the AF processing, the focus detection processing described above is executed based on an output signal sequence from the pixel row included in the focus detection area that is set in the upper photoelectric conversion layer 41. When the body control unit 14 completed execution of the AE and AF processing described above, the program proceeds to step S13.

In step S13, the body control unit 14 executes shooting processing and the program proceeds to step S14. Specifically, the body control unit 14 controls the diaphragm 6 based on the AV and controls the image sensor 12 to perform photoelectric conversion for recording for a storage time on the basis of the TV. In step S14, the body control unit 14 executes the image signal generation processing by using output signals from the lower photoelectric conversion layer 43 and the obtained image signal is subjected to predetermined image processing (gradation processing, contour enhancement, white balance adjustment processing and so on). When the body control unit 14 has executed the image processing, the program proceeds to step S15.

In step S15, the body control unit 14 controls the liquid crystal display element 16 to display the captured image thereon and the program proceeds to step S16. In step S16, the body control unit 14 generates an image file for recording and the program proceeds to step S17. In step S17, the body control unit 14 records the generated image file in a memory card 20 and terminates the processing in FIG. 18.

According to the embodiment described above, the following operations and advantageous effects can be obtained.

(1) The digital camera system 1 is configured as follows. That is, the digital camera system 1 includes the image sensor 12 that captures an image of a subject with a light flux from a subject that passes through the interchangeable lens 2; the body control unit 14 that generates an image signal on the basis of output signals from the image sensor 12; and the body control unit 14 detecting a focusing condition of the interchangeable lens 2 according to a phase detection method. The image sensor 12 has a pixel group in the upper photoelectric conversion layer 41 and a pixel group in the lower photoelectric conversion layer 43 that receives light fluxes from the subject that have passed through each pixel in the upper photoelectric conversion layer 41 and a microlens group arranged such that the light fluxes from the subject are guided to the pixel group in the upper photoelectric conversion layer 41; the pixel group in the upper photoelectric conversion layer 41 includes Cy pixels, Ye pixels, and Mg pixels having first, second, and third spectral sensitivities, respectively, differing from each other, arranged in a two-dimensional pattern such that behind each microlens 40, there are arranged one Cy pixel, one Ye pixel and two Mg pixels in a two-by-two matrix, with these four pixels receiving four light fluxes A through D, respectively, that pass through four pupil regions 81 through 84, respectively, of the exit pupil 80. The pixel group in the lower photoelectric conversion layer 43 includes R pixels, B pixels, and G pixels having fourth, fifth and sixth spectral sensitivities, respectively, which are complementary to the first, second and third spectral sensitivities, respectively, of the pixel group in the upper photoelectric conversion layer 41, arranged in a two dimensional pattern, with the positions of the Cy pixel, the Ye pixel and the Mg pixel in the upper photoelectric conversion layer 41 and the positions of the R pixel, the B pixel and the G pixel in the lower photoelectric conversion layer 43 are set such that the R pixel, the B pixel and the G pixel receive light fluxes that have passed through the Cy pixel, the Ye pixel and the Mg pixel, respectively. The body control unit 14 generates image signals on the basis of output signals from one of the pixel group in the upper photoelectric conversion layer 41 and the pixel group in the lower photoelectric conversion layer 43 whereas the body control unit 14 detects the focusing condition on the basis of output signals from the other of the pixel group in the upper photoelectric conversion layer 41 and the pixel group in the lower photoelectric conversion layer 43. With this configuration, the generation of image signals and the focus detection according to the phase detection method on the basis of output signals from the image sensor 12 can be executed without providing the image sensor 12 with any pixels that are dedicated for focus detection.

(2) In the digital camera system 1 in (1) above, it is further configured such that among the Cy pixels, the Ye pixels and the Mg pixels in the pixel group of the upper photoelectric conversion layer 41, those pixels having substantially the same spectral sensitivities (in other words, pixels having the same color) are adjacently arranged so as to form two-by-two matrices and four other pixels that are adjacent to each of the two-by-two matrices are arranged behind four different microlenses 40, respectively, such that their positions with respect to the corresponding microlenses 40 are different from each other. With this configuration, the incident light fluxes can be optimally photoelectrically converted regardless of the angle of incidence of light to the microlens 40.

(3) In the digital camera system 1 in (2) above, a configuration is adopted, in which the pixel group in the upper photoelectric conversion layer 41 provides output signals relating to Cy, Ye and Mg from the first, second and third pixels, respectively, whereas the pixel group in the lower photoelectric conversion layer 43 provides output signals relating to complementary colors of Cy, Ye and Mg from the fourth, fifth and sixth pixels, respectively. With this configuration, red, green and blue color image signals can be obtained from the output signals from the image sensor 12.

(4) In the digital camera system 1 in (3) above, a configuration is adopted, in which the pixel groups of the upper photoelectric conversion layer 41 and the lower photoelectric conversion layer 43 each are formed by arranging, in a two-dimensional pattern, a plurality of sets of pixels, each of which sets includes four pixels arrayed in a two-by-two matrix behind one microlens 40, the sets include first through fourth sets P1 through P4 in which arrangements of pixels are different from each other. The pixel group in the upper photoelectric conversion layer 41 is configured such that in the first set P1, a Cy pixel and an Mg pixel are arrayed adjacent to each other in the horizontal direction and an Mg pixel and a Ye pixel are arrayed adjacent to the horizontally arrayed Cy and Mg pixels, respectively, in the vertical direction. In the second set P2, an Mg pixel and a Cy pixel are arrayed adjacent to each other in the horizontal direction and a Ye pixel and an Mg pixel are arrayed adjacent to the horizontally arrayed Mg and Cy pixels, respectively, in the vertical direction. In the third set P3, an Mg pixel and a Ye pixel are arrayed adjacent to each other in the horizontal direction and a Cy pixel and an Mg pixel are arrayed adjacent to the horizontally arrayed Mg and Ye pixels, respectively, in the vertical direction. In the fourth set P4, a Ye pixel and an Mg pixel are arrayed adjacent to each other in the horizontal direction and an Mg pixel and a Cy pixel are arrayed adjacent to the horizontally arrayed Mg and Ye pixels, respectively, in the vertical direction. The first set P1 and the second set P2 are adjacent to each other in the horizontal direction and alternately arrayed in a repeated manner in the horizontal direction. The third set P3 and the fourth set P4 are adjacent to each other in the horizontal direction and alternately arrayed in a repeated manner in the horizontal direction. A first line L1 formed by the first set P1 and the second set P2 and a second line L2 formed by the third set P3 and the fourth set P4 are adjacent to each other in the vertical direction and alternately arrayed in a repeated manner in the vertical direction. With this configuration, focus detection according to the phase detection method can be performed on the basis of an output signal from the image sensor 12 and any of the first through third image signal processing described above can be executed.

(5) In the digital camera system 1 in any one of (2) through (4) above, a configuration is adopted, in which the body control unit 14 adds output signals from four adjacent R pixels in a two-by-two matrix, adds output signals from four adjacent B pixels in a two-by-two matrix, and adds output signals from four adjacent G pixels in a two-by-two matrix, thereby forming an image signal of a Bayer arrangement (that is, executing the second image signal generation processing). With this configuration, optimal image signals can be generated regardless of the incident angle of light into the microlenses 40. Furthermore, a conventional image processing engine that executes color interpolation of a Bayer arrangement can be used in the color interpolation processing.

(6) In the digital camera system 1 in any one of (1) through (4) above, a configuration is adopted, in which the body control unit 14 obtains three color signals at a position of each of the microlenses on the basis of output signals from the R, B and G pixels positioned behind each of the microlenses 40 (that is, executes the first image signal generation processing). With this configuration, color image signals can be obtained without executing color interpolation processing.

(7) In the digital camera system 1 in any one of (1) through (4) above, a configuration is adopted, in which the body control unit 14 executes color interpolation processing for generating signals for two other spectral components at each position of R, B and G pixels to obtain three color signals and generates a luminance signal and color difference signals on the basis of the three color signals (that is, executes the third image signal generation processing). With this configuration, image signals having high resolutions can be obtained.

(8) In the digital camera system 1 in any one of (1) through (7) above, a configuration is adopted, in which the body control unit 14 detects the focusing condition of the interchangeable lens 2 on the basis of outputs signals from a pair of pixels out of the pixels in the pixel group of the upper photoelectric conversion layer 41, the pair of pixels having substantially the same spectral sensitivities and having different positions from each other with respect to the microlens 40. With this configuration, the focusing condition can be detected according to the phase detection method appropriately based on the output signals from the image sensor 12.

(9) In the digital camera system 1 in (4) above, a configuration is adopted, in which the body control unit 14 detects the focusing condition of the interchangeable lens 2 in the horizontal direction on the basis of output signals from Mg pixels included in the first set P1 and the second set P2, respectively, among the pixels in the pixel groups in the upper photoelectric conversion layer 41. With this configuration, the focusing condition can be detected in the horizontal direction of the image sensor 12 according to the phase detection method appropriately based on the output signals from the image sensor 12.

(10) In the digital camera system 1 in (4) above, a configuration is adopted, in which the body control unit 14 detects the focusing condition of the imaging optical system in the vertical direction on the basis of output signals from the Mg pixels included in the second set P2 and the fourth set P4, respectively, among the pixels in the pixel groups of the upper photoelectric conversion layer 41. With this configuration, the focusing condition can be detected according to the phase detection method appropriately.

(11) In the digital camera system 1 in (4) above, a configuration is adopted, in which the body control unit 14 detects the focusing condition of the interchangeable lens 2 in a direction oblique to the horizontal direction on the basis of output signals from the Mg pixels included in the second set P2 and the third set P3, respectively, among the pixels in the pixel group of the upper photoelectric conversion layer 41. With this configuration, the focusing condition can be appropriately detected according to the phase detection method.

(Variation Example 1)

In the embodiment described above, the focus detection processing is executed by using output signals from the Mg pixels in the upper photoelectric conversion layer 41. However, the focus detection processing may also be executed by using output signals from the Cy pixels or the Ye pixels.

The body control unit 14 according to Variation Example 1 is configured to obtain evaluation values by using output signals from the upper photoelectric conversion layer 41. The evaluation values are cumulative values of output signals for each of, for instance, Cy, Mg or Ye pixels. When the cumulative value for the Mg pixels is low, it may be possible that output signals from the Mg pixels cannot afford appropriate calculation of defocus amounts. Then, the body control unit 14 according to Variation Example 1 executes, when the cumulative value for the Mg pixels is equal to or lower than a predetermined threshold value, the above-mentioned focus detection processing by using either one of Cy pixel or Ye pixel that has a greater cumulative value than that of the rest. With this configuration, appropriate focus detection processing can be executed even when a subject having a small amount of Mg components is shot.

(Variation Example 2)

In the embodiment described above, out of the first through third image signal generation processing, the processing that is indicated by initial setting is used to generate image signals for recording. However, the present invention is not limited thereto.

For instance, the body control unit 14 according to Variation Example 2, when a through image is to be displayed, selects the first image signal generation processing in which image signals can be generated without executing color interpolation processing and generates image signals by using the selected first image signal generation processing. On the other hand, for the images for recording, the third image signal generation processing capable of generating image signals having high resolutions is selected and image signals are generated by using the selected third image signal generation processing. As described above, the body control unit 14 according to Variation Example 2 is configured to select, upon image signal generation, any of the first, second and third image signal generation processing. With this configuration, image signal generation processing that is suitable for uses of images to be generated can be selected. For instance, the first image signal generation processing which does not require any color interpolation processing is selected in a scene where it is desired to display images on a real-time basis, whereas the third image signal generation processing is selected in a scene where it is desired to record images with high image quality.

In addition, the body control unit 14 may be configured to generate image signals by the first or second image signal generation processing for video images or by the third image signal generation processing for still images.

In addition, the body control unit 14 may be configured to generate image signals by using, for instance, both of the first image signal generation processing and the second image signal generation processing. In this case, the body control unit 14 controls, for instance, both the image generated by the first image signal generation processing and the image generated by the second image signal generation processing to be displayed on a display device (not shown) on the rear side. The body control unit 14 records one of the two displayed images, which one is selected by the user through the operating member 18 into the memory card 20.

(Variation Example 3)

In the embodiment described above, the configuration is adopted in which the defocus amount in the horizontal direction is obtained on the basis of output signal from the pixel row 90 constituted by the Mg pixel (Mg-b) included in each of the first sets P1 and the Mg pixel (Mg-a) included in each of the second sets P2 among the pixels in the upper photoelectric conversion layer 41. However, the present invention is not limited thereto. A configuration may be adopted, in which the defocus amount in the horizontal direction is obtained on the basis of output signals from a pixel row constituted by the Mg pixel (Mg-d) included in each of the third sets P3 and the Mg pixel (Mg-c) included in each of the fourth sets P4. Alternatively, the defocus amount in the horizontal direction may be obtained on the basis of both the above pixel row and the pixel row 90.

In addition, in the embodiment described above, the configuration is adopted in which the defocus amount in the vertical direction is obtained on the basis of output signals from the pixel row 120 constituted by the Mg pixel (Mg-a) included in each of the second sets P2 and the Mg pixel (Mg-c) included in each of the fourth sets P4. However, the present invention is not limited thereto. A configuration may be adopted in which the defocus amount in the vertical direction is obtained on the basis of output signals from a pixel row constituted by the Mg pixel (Mg-b) included in each of the first sets P1 and the Mg pixel (Mg-d) included in each of the third sets P3. Alternatively, the defocus amount in the horizontal direction may be obtained on the basis of both the above pixel row and the pixel row 120.

In the embodiment described above, the configuration is adopted, in which the defocus amount in an oblique direction is obtained on the basis of output signals from the pixel row 150 constituted by the Mg pixels (Mg-a) and (Mg-d) included in each of the second set P2 and the Mg pixels (Mg-a) and (Mg-d) included in each of the third set P3.

However, the present invention is not limited thereto. A configuration may be adopted, in which the defocus amount in the oblique direction is obtained on the basis of the pixel row constituted by the Mg pixels (Mg-b) and (Mg-c) included in each of the first set P1 and the Mg pixels (Mg-b) and (Mg-c) included in each of the fourth set P4. Alternatively, the defocus amount in the oblique direction may be obtained on the basis of both the above pixel row and the pixel row 150.

(Variation Example 4)

In the embodiment described above, a configuration is adopted, in which Mg pixels, Cy pixels and Ye pixels are provided in the upper photoelectric conversion layer 41 and G pixels, R pixels and B pixels are provided in the lower photoelectric conversion layer 43. In place of this, a configuration may be adopted, in which G pixels, R pixels and B pixels are provided in the upper photoelectric conversion layer and Mg pixels, Cy pixels and Ye pixels are provided in the lower photoelectric conversion layer (Variation Example 5)

In the embodiment described above, the present invention is applied to the digital camera system 1 having a configuration such that the interchangeable lens 2 is mounted to the camera body 3. However, the present invention is not limited thereto. For instance, the present invention may also be applied to a lens-integrated digital camera.

The above description is by way of example and the present invention is not limited to the embodiment described above. In addition, the embodiment described above may be combined with the configuration(s) of one or more of the variation examples in any desired manner.

Although various embodiments and variations have been described above, the present invention is not limited thereto. Other aspects that may be conceivable within the scope of technical ideas of the present invention are also embraced by the present invention.

The disclosure of the following priority application is herein incorporated by reference: Japanese Patent Application No. 2012-081165 (filed on Mar. 30, 2012).

The invention claimed is:

1. An image sensor, comprising:
a first image-capturing unit that includes a first pixel and a second pixel each receiving a light having a first wavelength and a third pixel and a fourth pixel each receiving a light having a second wavelength different from the first wavelength, the first pixel, the third pixel, the fourth pixel and the second pixel being arranged in such order consecutively in a first direction on the first image-capturing unit; and
a second image-capturing unit that includes a fifth pixel receiving a light transmitted through the first pixel, a sixth pixel receiving a light transmitted through the second pixel, a seventh pixel receiving a light transmitted through the third pixel and an eighth pixel receiving a light transmitted through the fourth pixel, the fifth pixel, the seventh pixel, the eighth pixel and the sixth pixel being arranged in such order consecutively in the first direction on the second image-capturing unit.

2. The image sensor according to claim 1, wherein
a color component of the light having the first wavelength is complementary to a component of the light transmitted through the first pixel or the light transmitted through the second pixel.

3. The image sensor according to claim 1, wherein
a color component of the light having the second wavelength is complementary to a component of the light transmitted through the third pixel or the light transmitted through the fourth pixel.

4. The image sensor according to claim 1, further comprising:
a first microlens; and
a second microlens, wherein
the first pixel and the third pixel each receive a light transmitted through the first microlens; and
the second pixel and the fourth pixel each receive a light transmitted through the second microlens.

5. The image sensor according to claim 4, wherein
at least one of a set of signals output from the first pixel and the second pixel, a set of signals output from the third pixel and the fourth pixel, a set of signals output from the fifth pixel and the sixth pixel and a set of signals output from the seventh pixel and the eighth pixel are used for a focus detection.

6. The image sensor according to claim 1, wherein:
at least one of a set of signals output from the third pixel and the fourth pixel and a set of signals output from the seventh pixel and the eighth pixel are added to each other and output.

7. The image sensor according to claim 1, wherein:
a signal obtained by adding a set of signals output from the third pixel and the fourth pixel to each other is used for a correction of each of a set of signals output from the first pixel and the second pixel.

8. The image sensor according to claim 7, wherein
the correction corresponds to color interpolation processing.

9. The image sensor according to claim 1, wherein:
a signal obtained by adding a set of signals output from the seventh pixel and the eighth pixel to each other is used for a correction of each of a set of signals output from the fifth pixel and the sixth pixel.

10. An image sensor, comprising:
a first image-capturing unit that includes a first pixel and a second pixel each receiving a light having a first wavelength and a third pixel and a fourth pixel each receiving a light having a second wavelength different from the first wavelength, the first pixel, the third pixel, the fourth pixel and the second pixel being arranged in such order in a first direction on the first image-capturing unit;
a second image-capturing unit that includes a fifth pixel receiving a light transmitted through the first pixel, a sixth pixel receiving a light transmitted through the second pixel, a seventh pixel receiving a light transmitted through the third pixel and an eighth pixel receiving a light transmitted through the fourth pixel, the fifth pixel, the seventh pixel, the eighth pixel and the sixth pixel being arranged in such order in the first direction on the second image-capturing unit;
a first microlens; and
a second microlens, wherein
the first pixel and the third pixel each receive a light transmitted through the first microlens; and
the second pixel and the fourth pixel each receive a light transmitted through the second microlens.

11. The image sensor according to claim 10, wherein
a color component of the light having the first wavelength is complementary to a component of the light transmitted through the first pixel or the light transmitted through the second pixel.

12. The image sensor according to claim 10, wherein
a color component of the light having the second wavelength is complementary to a component of the light transmitted through the third pixel or the light transmitted through the fourth pixel.

13. The image sensor according to claim 10, wherein at least one of a set of signals output from the first pixel and the second pixel, a set of signals output from the third pixel and the fourth pixel, a set of signals output from the fifth pixel and the sixth pixel and a set of signals output from the seventh pixel and the eighth pixel are used for a focus detection.

14. The image sensor according to claim 10, wherein: at least one of a set of signals output from the third pixel and the fourth pixel and a set of signals output from the seventh pixel and the eighth pixel are added to each other and output.

15. The image sensor according to claim 10, wherein: a signal obtained by adding a set of signals output from the third pixel and the fourth pixel to each other is used for a correction of each of a set of signals output from the first pixel and the second pixel.

16. The image sensor according to claim 15, wherein the correction corresponds to color interpolation processing.

17. The image sensor according to claim 10, wherein: a signal obtained by adding a set of signals output from the seventh pixel and the eighth pixel to each other is used for a correction of each of a set of signals output from the fifth pixel and the sixth pixel.

\* \* \* \* \*